US011398480B2

(12) United States Patent
Zhang et al.

(10) Patent No.: US 11,398,480 B2
(45) Date of Patent: Jul. 26, 2022

(54) TRANSISTOR HAVING FORKED NANOSHEETS WITH WRAPAROUND CONTACTS

(71) Applicant: International Business Machines Corporation, Armonk, NY (US)

(72) Inventors: Jingyun Zhang, Albany, NY (US); Ruilong Xie, Niskayuna, NY (US); Alexander Reznicek, Troy, NY (US); Xin Miao, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 211 days.

(21) Appl. No.: 16/874,733

(22) Filed: May 15, 2020

(65) Prior Publication Data

US 2021/0358911 A1 Nov. 18, 2021

(51) Int. Cl.
*H01L 27/092* (2006.01)
*H01L 29/423* (2006.01)
(Continued)

(52) U.S. Cl.
CPC .. *H01L 27/0924* (2013.01); *H01L 21/823821* (2013.01); *H01L 29/0665* (2013.01); *H01L 29/42392* (2013.01)

(58) Field of Classification Search
CPC ......... H01L 21/02603; H01L 21/76897; H01L 21/768; H01L 21/76816; H01L 21/823431;
(Continued)

(56) References Cited

U.S. PATENT DOCUMENTS 9,484,423 B2 11/2016 Obradovic et al.
9,570,609 B2 2/2017 Obradovic et al.
(Continued)

OTHER PUBLICATIONS

Clarke "Here comes the forksheet transistor" eeNews, May 20, 2019, <URL: https://www.eenewsanalog.com/news/here-comes-forksheet-transistor-says-imec> (4 pages).
Weckx et al., "Stacked nanosheet fork architecture for SRAM design and device co-optimization toward 3nm" 2017 IEEE International Electron Devices Meeting (IEDM), Dec. 2, 2017, (4 pages).

*Primary Examiner* — David C Spalla
(74) *Attorney, Agent, or Firm* — Cantor Colburn LLP; Jeffrey S LaBaw

(57) ABSTRACT

A fork-sheet semiconductor device includes a first-type source/drain region on a substrate and a second-type source/drain region on the substrate and separated from the first-type source/drain region by an insulator pillar. The fork-sheet semiconductor device further includes a first metal portion and a second metal portion. The first metal portion completely covers a first upper surface and a first exposed sidewall the first-type source/drain region and the second metal portion completely covers a second upper surface and a second exposed sidewall the second-type source/drain region. The first and second metal portions are separated from one another by the insulator pillar. A first-type contact portion extends vertically from the first metal portion and an opposing second-type contact portion extends vertically from the second metal portion. A first upper interconnect structure contacts the first-type contact portion and a second upper interconnect structure contacts the second-type contact portion.

20 Claims, 22 Drawing Sheets

(51) Int. Cl.
   *H01L 21/8238* (2006.01)
   *H01L 29/06* (2006.01)

(58) Field of Classification Search
   CPC ..... H01L 21/823475; H01L 21/823814; H01L 21/823821; H01L 21/823871; H01L 21/845; H01L 27/0886; H01L 27/0924; H01L 27/10879; H01L 27/1211; H01L 29/0665; H01L 29/0669; H01L 29/0673; H01L 29/0847; H01L 29/401; H01L 29/41791; H01L 29/66439; H01L 29/665; H01L 29/66795; H01L 29/6681; H01L 29/72392; H01L 29/775; H01L 29/785; H01L 29/7851; H01L 29/7853; H01L 29/7855; H01L 2029/7858
   See application file for complete search history.

(56) References Cited

U.S. PATENT DOCUMENTS

| | | |
|---|---|---|
| 9,847,390 B1 * | 12/2017 | Xie .................. H01L 29/78684 |
| 10,074,727 B2 | 9/2018 | Adusumilli et al. |
| 10,084,094 B1 | 9/2018 | Cheng et al. |
| 10,134,905 B2 | 11/2018 | Guillorn et al. |
| 10,192,867 B1 | 1/2019 | Frougier et al. |
| 10,236,292 B1 * | 3/2019 | Frougier ......... H01L 21/823864 |
| 10,276,442 B1 | 4/2019 | Xie et al. |
| 2017/0047256 A1 * | 2/2017 | Cheng .............. H01L 21/28518 |
| 2018/0374958 A1 | 12/2018 | Guillorn et al. |
| 2019/0165118 A1 | 5/2019 | Leobandung |
| 2020/0006160 A1 * | 1/2020 | Lin .................... H01L 29/0847 |
| 2020/0119180 A1 * | 4/2020 | Frougier ......... H01L 21/823418 |

\* cited by examiner

TRANSISTOR HAVING FORKED NANOSHEETS WITH WRAPAROUND CONTACTS

BACKGROUND

The present invention relates in general to fabrication methods and resulting structures for semiconductor devices. More specifically, the present invention relates to fabrication methods and resulting fork-sheet semiconductor devices.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. FinFETs are non-planar, three-dimensional (3D) devices that include a fin-shaped element that defines the source, drain, and channel regions of the FinFET. A gate stack is formed over and around a central region of the fin-shaped element, and the portion of the fin that is under the gate stack functions as the FinFET channel. The portions of the fin-shaped element that are not under the gate stack function as the source region and the drain region, respectively. Nanosheet transistors are similar to FinFETs except the channel portion of the fin is formed as multiple spaced-apart channel nanosheets, and the gate stack wraps around the full perimeter of each nanosheet channel region for improved control of channel current flow. Nanosheet transistors enable full depletion in the nanosheet channel regions and reduce short-channel effects.

SUMMARY

According to a non-limiting embodiment of the invention, a method of forming a fork-sheet semiconductor device is provided. The method includes forming a first-type source/drain region and a second-type source/drain region separated from the first-type source/drain region by an insulator pillar, and depositing a metal coating that encapsulates the first-type source/drain region, the second-type source/drain region, and the insulator pillar. The method further includes recessing the metal coating to form an inter-contact trench that defines a first-type contact portion and an opposing second-type contact portion separated from the first-type contact portion by the insulator pillar. The method further includes forming a first upper interconnect structure on the first-type contact portion and a second upper interconnect structure on the second-type contact portion, the second upper interconnect structure electrically isolated from the first upper interconnect structure.

According to another non-limiting embodiment of the invention, a fork-sheet semiconductor device is provided. The fork-sheet semiconductor device includes a first-type source/drain region on a substrate and a second-type source/drain region on the substrate and separated from the first-type source/drain region by an insulator pillar. The fork-sheet semiconductor device further includes a first metal portion and a second metal portion. The first metal portion completely covers a first upper surface and a first exposed sidewall of the first-type source/drain region and the second metal portion completely covers a second upper surface and a second exposed sidewall of the second-type source/drain region. The first and second metal portions are separated from one another by the insulator pillar. A first-type contact portion extends vertically from the first metal portion and an opposing second-type contact portion extends vertically from the second metal portion. A first upper interconnect structure contacts the first-type contact portion and a second upper interconnect structure contacts the second-type contact portion.

According to yet another non-limiting embodiment of the invention, a fork-sheet semiconductor device is provided. The fork-sheet semiconductor device includes a first-type source/drain region on a substrate and a second-type source/drain region on the substrate and separated from the first-type source/drain region by an insulator pillar. A first silicide layer completely coats a first upper surface and a first exposed sidewall of the first-type source/drain region and a second silicide layer that completely coats a second upper surface and a second exposed sidewall of the second-type source/drain region. The first and second silicide layers are separated from one another by the insulator pillar that is interposed therebetween. The fork-sheet semiconductor device further includes a wrap-around contact having a first metal portion completely covering the first silicide layer and a second metal portion completely covering the second silicide layer. A first-type contact portion extends vertically from the first metal portion and an opposing second-type contact portion extending vertically from the second metal portion. A first upper interconnect structure contacts the first-type contact portion and a second upper interconnect structure contacts the second-type contact portion.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
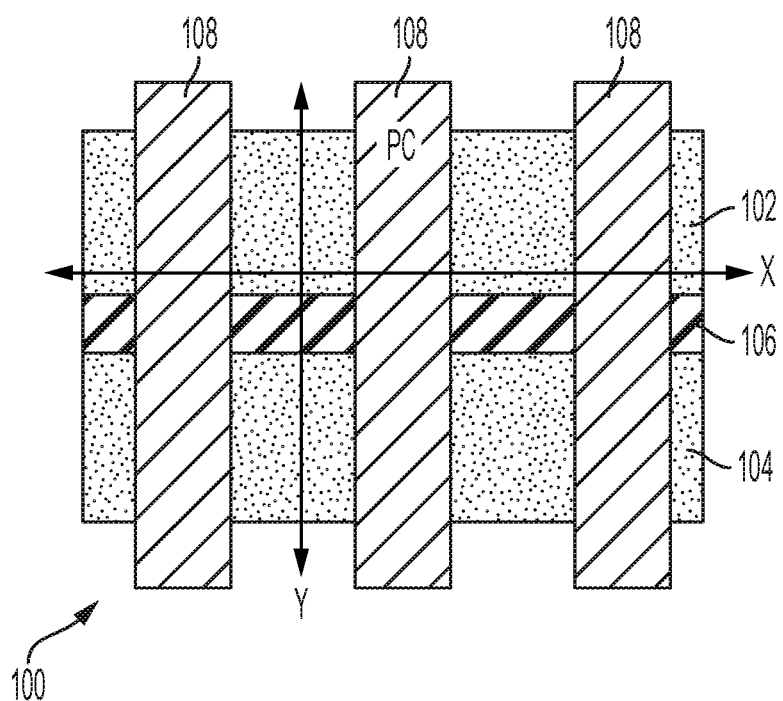
FIG. 1 is a reference diagram showing a configuration of nanosheet transistors.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Although this detailed description includes examples of how aspects of the invention can be implemented to form confined S/D regions with wrap-around S/D contacts in an exemplary FinFET semiconductor device architecture having silicon (Si) channel fins and silicon germanium (SiGe) S/D regions, implementation of the teachings recited herein are not limited to a particular type of FET structure or combination of materials. Rather, embodiments of the present invention are capable of being implemented in conjunction with any other type of transistor device (e.g., planar FETs, vertical FETs, nanosheet transistors, and the like) or material, now known or later developed, wherein confined S/D regions are utilized, and wherein it is desirable to reduce resistance at the interface between the S/D contact and the S/D region through the use of a wrap-around S/D contact.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the FET as a non-planar FinFET architecture, wherein the channel of the FinFET is implemented as a fin-shaped structure, and wherein a gate stack is wrapped around sidewalls and a top surface of a central region of the fin-shaped structure. The portion of the fin-shaped structure that is under the gate stack functions as the channel, and the portions of the fin-shaped structure that are not under the gate stack are doped to function as the source region and the drain region, respectively. In some implementations, the fin-shaped structure is Si, and the S/D regions of the fin are formed as doped SiGe. The use of doped SiGe to form the S/D regions provides desirable device characteristics, including the introduction of strain at the various interfaces between SiGe and Si in the transistor.

Another known method of increasing channel conductivity and decreasing FET size is to form the channel as a nanosheet structure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial layers. The sacrificial layers are released from the channel nanosheets before the FET device is finalized. For n-type FETs, the channel nanosheets are typically Si and the sacrificial layers are typically SiGe. For p-type FETs, the channel nanosheets can be SiGe and the sacrificial layers can be Si. In some implementations, the channel nanosheet of a p-type FET can be SiGe or Si, and the sacrificial layers can be Si or SiGe. Similar to FinFET architectures, the S/D regions of a GAA nanosheet architecture can be formed from doped SiGe. Forming the S/D regions from SiGe, and the use of multiple layered SiGe/Si sacrificial/channel nanosheets (or Si/SiGe sacrificial/channel nanosheets) provide desirable device characteristics, including the introduction of strain at the interface between SiGe and Si.

As semiconductor devices continue to decrease in size, it has become desirable to provide distances between the near-most nFET and pFET fins (i.e., the "N2P space") on the order of about 8 nanometers (nm) to about 10 nm. Providing N2P spaces at these dimensions can present challenges to communicating with the pFET section and the nFET section. Specifically, N2P spaces on this order reduce the process window within which contact structures connecting the nFET section and pFET section do not electrically short with one another. N2P spaces on this order also reduce the process window within which the R/C electrical characteristics of the semiconductor device are acceptable. And while the process window can be broadened by positioning the contact structure at locations laterally offset from the N2P space, such positioning increases the electrical resistance between the contact structures and the respective pFET section and nFET section, offsetting the improvement in process window and/or electrical characteristics of the multilayer IC device. However, reductions in N2P space decrease R/C performance while also increasing the possibility of contact-to-contact shorting due to the reduced distance between the contact structures connected to the nFET fins and the pFET fins.

The trend to continue reducing the footprint of FET devices has led to the development of forked nanosheet semiconductor devices, also referred to as "fork-sheet devices." A fork-sheet device implements nanosheets that are controlled by a tri-gate forked structure. The tri-gate forked structure is realized by forming a dielectric wall between the P- and NMOS devices. The dielectric wall physically isolates the p-gate trench from the n-gate trench, allowing much tighter n-to-p spacing that facilitates superior area and performance scalability compared to traditional nanosheet devices. However, the reduced scalability achieved by fork-sheet devices along with the introduction of the insulator pillar makes it difficult to maximize the source/drain contact area.

Turning now to an overview of aspects of the invention, embodiments of the invention provide fabrication methods and resulting structures for forming on a semiconductor device having confined/embedded "forked" nanosheet S/D/ with wrap-around S/D contacts. In embodiments of the invention, the semiconductor device includes a p-doped field effect transistor (pFET) section and an n-doped field effect transistor (nFET) section. In one or more embodiments of the invention, the pFET section establishes a pFET fork-sheet device and the nFET section establishes an nFET fork-sheet device.

The pFET section includes pFET nanosheets and a pFET source/drain region partially surrounding the pFET nanosheets. The n-doped field effect transistor (nFET) section includes nFET nanosheets and an nFET source or drain region partially surrounding the nFET nanosheets. An insulator pillar with a topmost surface is arranged between the pFET section and the nFET section. The semiconductor device further includes a wraparound contact that is formed below the topmost surface of the insulator pillar. A first portion of the wraparound contact wraps around the pFET source/drain region, while a second portion of the wraparound contact wraps around the nFET soured/drain region. The first and second portions of the wraparound contact are separated from one another by the insulator pillar. A first upper interconnect structure is formed on the first portion of the wraparound contact and a second upper interconnect structure is formed on the second portion of the wraparound contact. In this manner, the contact area at the pFET source/drain region and the nFET soured/drain region can be maximized.

In accordance with aspects of the invention, the pFET contact structure has a pFET vertical portion abutting the pFET section and spaced apart from the insulator pillar by the pFET section. The pFET vertical portion provides additional interface area between the pFET contact structure and the pFET section. The pFET vertical portion of the pFET contact structure can be relatively lateral width small, e.g., smaller in lateral width than the pFET section.

In accordance with aspects of the invention, the pFET contact structure has a pFET horizontal portion abutting the pFET section and overlapping the pFET section, the pFET horizontal portion extending laterally from the insulator pillar. The pFET horizontal portion provides additional interface area between the pFET contact structure and the pFET section. The pFET horizontal portion of the pFET contact structure can be relatively small in horizontal width, e.g., smaller in horizontal width than the pFET section.

In accordance with aspects of the invention, the pFET contact structure has a pFET contact tapered portion connecting the pFET local interconnect structure to the pFET section. The pFET tapered portion of the pFET contact structure provides electrical separation between the pFET contact and the nFET contact. The pFET contact tapered portion can be separated from the nFET contact tapered portion by dielectric material of lateral thickness greater than that of the pFET contact tapered portion.

In accordance with aspects of the invention, the pFET local interconnect structure overlaps the pFET section and is laterally offset from the insulator pillar. The overlap of the pFET local interconnect structure provides additional surface area to contact a via structure for electrical communication with the pFET section. In accordance with aspect of the invention a pFET metal-filled via is connected to the pFET contact structure by the pFET local interconnect structure.

In accordance with aspects of the invention, an nFET contact structure is wrapped about the nFET section below the topmost surface of the insulator pillar. Wrapping the nFET contact structure about the nFET section provides a relatively large interface area between the nFET contact structure and the nFET section for electrical communication between the nFET contact structure and the nFET section.

In accordance with aspects of the invention, an nFET local interconnect structure abuts the nFET contact structure above the topmost surface of the insulator pillar. The nFET local interconnect structure provides additional area to connect a via structure to the nFET contact structure, allowing the via structure to have feature size larger than that of the nFET contact structure.

In accordance with aspects of the invention, the nFET local interconnect structure is laterally spaced apart from the nFET section by the nFET contact structure. Laterally spacing the nFET local interconnect structure from the nFET contact structure places the via structure at a location offset from the nFET section, e.g., over shallow-trench isolation spacing the nFET section from an adjacent transistor, increasing electrical resistance between the nFET contact structure and the laterally adjacent pFET contact structure. In accordance with aspects of the invention an interlayer dielectric-filled trench bounds the topmost surface of the insulator pillar and pFET local interconnect structure and the nFET contact structure separates the nFET local interconnect structure from the interlayer dielectric-filled trench.

In accordance with aspects of the invention, the nFET contact structure includes an nFET vertical portion abutting the nFET section and spaced apart from the insulator pillar by the nFET section and an nFET horizontal portion abutting the nFET section and overlapping the nFET section. The nFET horizontal portion extends laterally from the insulator pillar and an nFET tapered portion connecting the nFET local interconnect structure to the nFET section. The nFET section vertical portion and the nFET section horizontal portion provide a relatively large contact area between the nFET section and the nFET contact for electrical communication between the nFET section and the nFET contact structure.

In accordance with aspects of the invention, the semiconductor device includes a dielectric-filled recess defined below the topmost surface of the insulator pillar. The dielectric-filled recess defined below the topmost surface of the insulator pillar provides electrical separation between the nFET contact structure horizontal portion and the nFET local interconnect structure. In accordance with aspects of the invention. In accordance with aspects of the invention the dielectric-filled recess separates the pFET local interconnect structure from the pFET section and the insulator pillar. The dielectric-filled recess provides electrical separation between the pFET local interconnect structure and the pFET section. In accordance with aspects of the invention the dielectric-filled recess laterally separates the topmost surface of the insulator pillar from the pFET contact structure.

In accordance with aspects of the invention, a semiconductor device includes a p-doped field effect transistor (pFET) section including pFET nanosheets and a pFET source/drain region partially surrounding the pFET nanosheets, an n-doped field effect transistor (nFET) section including nFET nanosheets and an nFET source or drain region partially surrounding the nFET nanosheets, and an insulator pillar with a topmost surface arranged between the pFET section and the nFET section, the topmost surface above the pFET section and the nFET section. A pFET contact structure is wrapped about the pFET section below the topmost surface of the insulator pillar and a pFET local interconnect structure abuts the pFET contact structure above the topmost surface of the insulator pillar. An nFET contact structure wrapped about the nFET section below the topmost surface of the insulator pillar and an nFET local interconnect structure abuts the nFET contact structure above the topmost surface of the insulator pillar.

In accordance with aspects of the invention, a method of making a semiconductor device includes forming a p-doped field effect transistor (pFET) section including pFET nanosheets and a pFET source/drain region partially surrounding the pFET nanosheets, forming an n-doped field effect transistor (nFET) section including nFET nanosheets and an nFET source or drain region partially surrounding the nFET nanosheets, and forming an insulator pillar with a topmost surface between the pFET section and the nFET section, the topmost surface above the pFET section and the nFET section. A pFET contact structure is formed wrapping about the pFET section below the topmost surface of the insulator pillar and a pFET local interconnect structure is formed abutting the pFET contact structure above the topmost surface of the insulator pillar.

In accordance with aspects of the invention, forming a pFET contact structure wrapped about the pFET section below the topmost surface of the insulator pillar includes depositing a metal layer over the pFET section, the nFET section, and the topmost surface of the insulator pillar, defining a contact-separating trench having a lower recess below the topmost surface of the insulator pillar within the metal layer, and filling the contact-separating trench with a dielectric material.

In accordance with aspects of the invention, forming a pFET local interconnect structure abutting the pFET contact structure above the topmost surface of the insulator pillar includes defining an interconnect trench within the dielectric material adjacent to the nFET contact structure and above the topmost surface of the insulator pillar and filling the interconnect trench with an interconnect metal. In accordance with aspects of the invention the method also includes forming an nFET contact structure wrapped about the nFET section below the topmost surface of the insulator pillar and forming an nFET local interconnect structure abutting the nFET contact structure above the topmost surface of the insulator pillar.

In accordance with aspects of the invention, forming an nFET contact structure wrapped about the nFET section below the topmost surface of the insulator pillar includes depositing a metal layer over the pFET section, the nFET section, and the topmost surface of the insulator pillar. A contact-separating trench is defined having a lower recess below the topmost surface of the insulator pillar within the metal layer, the contact-separating trench over the pFET section and the nFET section, the contact-separating trench filled with a dielectric material, and an nFET local interconnect structure formed abutting the nFET contact structure above the topmost surface of the insulator pillar.

Figure 2:
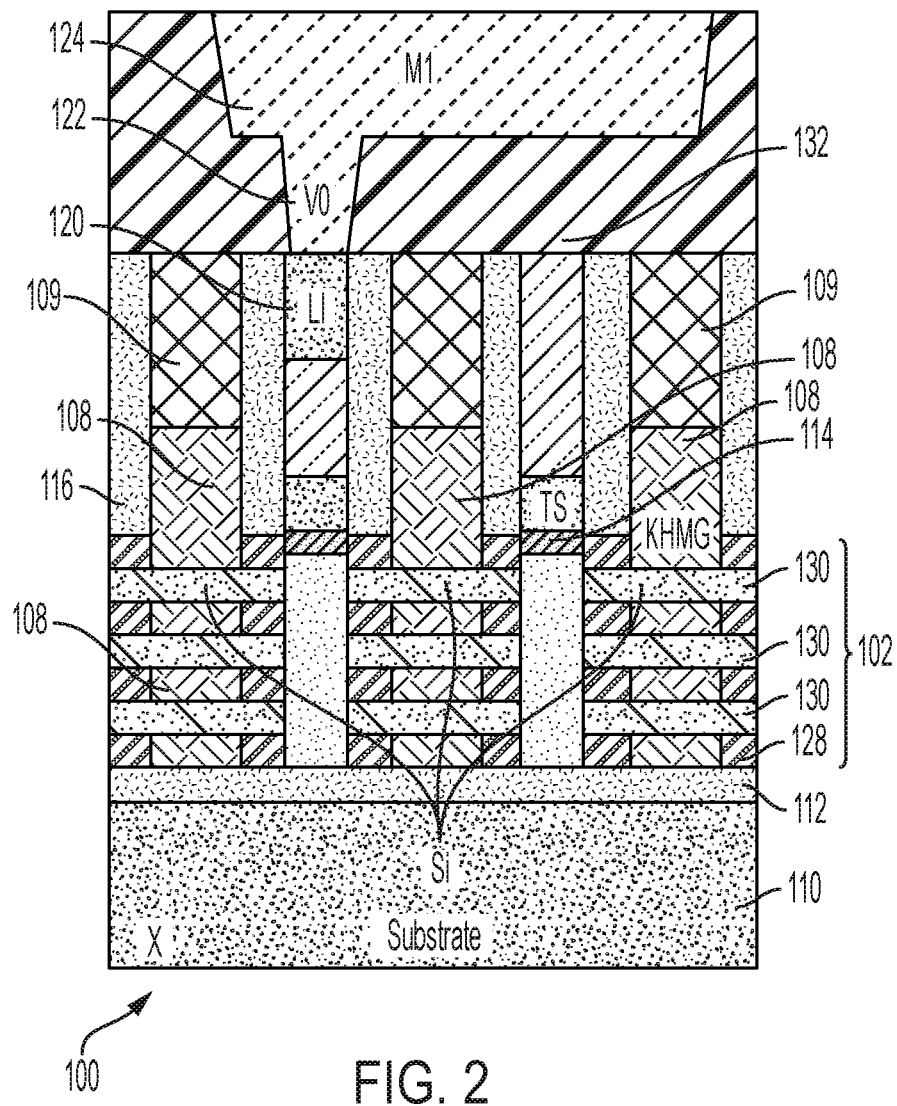
FIG. 2 depicts a cross-sectional view of a semiconductor device along the line X of FIG. 1 after a processing operation according to one or more embodiments of the invention.
Figure 3:
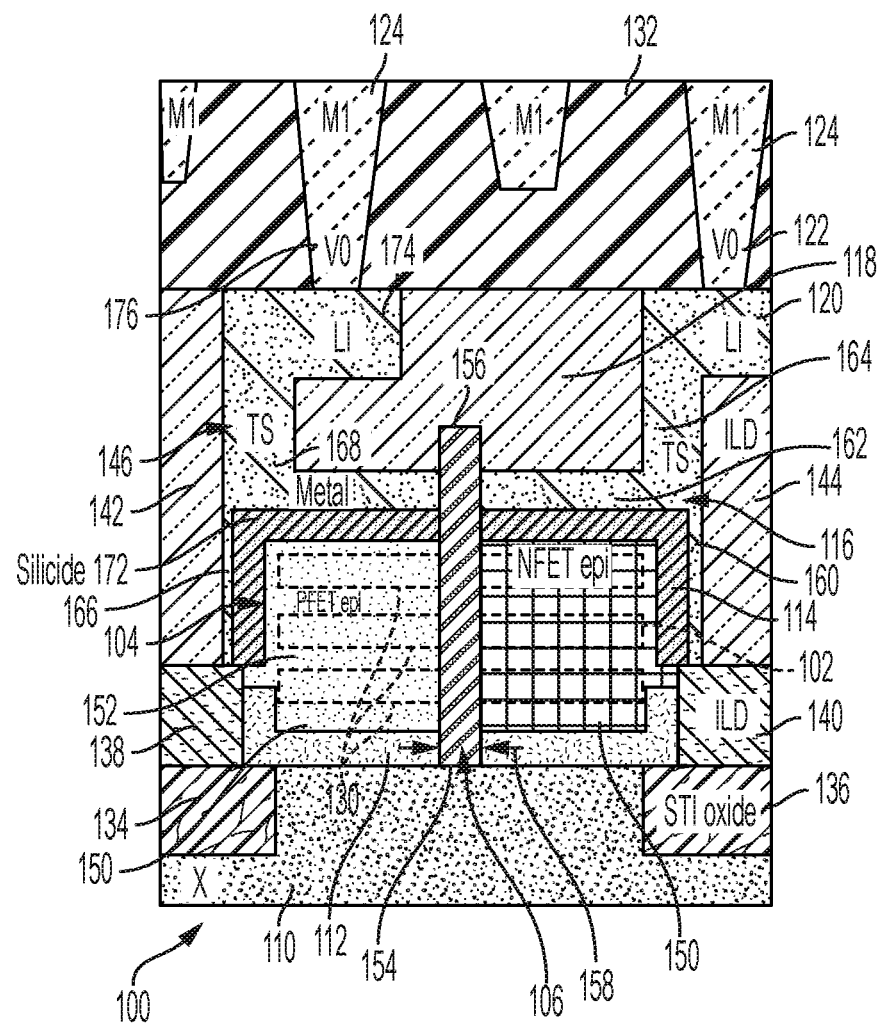
FIG. 3 depicts a cross-sectional view of the semiconductor device along the line Y of FIG. 1 after a processing operation according to one or more embodiments of the invention.

Turning now to a more detailed description of aspects of the invention, FIGS. 1, 2 and 3 are schematic views of a semiconductor device 100. In particular, FIG. 1 is a plan view of the semiconductor device 100 showing an X cut line for an X-Z plane and a Y cut line for Y-Z plane. FIG. 2 is a cross-sectional view of the semiconductor device 100 device taken along the X cut line of FIG. 1, showing the X-Z plane of the semiconductor device 100. FIG. 3 is a cross-sectional view of the semiconductor device 100 taken along the Y cut line of FIG. 1, showing the Y-Z plane of the semiconductor device 100. The terms "vertical" or "vertical direction" or "vertical height" as used herein denote a Z-direction of the Cartesian coordinates shown in the drawings, the term "longitudinal" as used herein denotes position in the X-direction along the X cut line in the X-Z plane of the semiconductor device 100, and the term "lateral" as used herein denotes position along the Y cut line in the Y-Z plane of the semiconductor device 100.

Referring to FIG. 1, the semiconductor device 100 includes a n-type field effect transistor (nFET) section 102, an p-type field effect transistor (pFET) section 104, an insulator pillar 106, and gate structures 108. The pFET section 104 is arranged on a side to the semiconductor device 100 laterally opposite the nFET section 102. The insulator pillar 106 is arranged laterally between the pFET section 104 and the nFET section 102 and extends longitudinally along the semiconductor device 100 between the pFET section 104 and the nFET section 102. The gate structures 108 (e.g., a gate electrodes) span the insulator pillar 106, wrap around the pFET section 104 and the nFET section 102 of the semiconductor device, and are longitudinally spaced from one another along the semiconductor device 100.

With reference to FIG. 2 and FIG. 3, a portion of the semiconductor device 100 along the X-cut (shown in FIG. 1) and along the Y-cut (shown in FIG. 1) is cross-sectionally shown. As depicted in FIG. 2 and FIG. 3, the semiconductor device 100 includes a semiconductor substrate 110, a bottom dielectric isolation layer 112, a silicide layer 172, and a contact structure 146. The semiconductor device 100 also includes an intercontact dielectric-filled trench 118, a local interconnect structure 174, a metal-filled via 176, and a lowermost metal interconnect layer 124. In some examples, the semiconductor substrate 110 is a silicon wafer, however, the material is not limited thereto. The bottom dielectric isolation layer 112 overlays the semiconductor substrate 110 and provides electrical isolation between the pFET section 104 and nFET section 102 (shown in FIG. 1), and the semiconductor substrate 110.

The pFET section 104 overlays the bottom dielectric isolation layer 112, and includes a plurality of Si nanosheets 130. The nanosheets 130 can be covered with a grown epi material 150 to define a pFET source/drain region 152. Inner spacer 128 (shown in FIG. 2) are formed to separate the PFET gate structures 108 from the pFET S/D region 152. Although shown in FIG. 2 and described herein as having three (3) pFET nanosheets 130, those of skill in the art will appreciate in view of the present disclosure will appreciate that the semiconductor device 100 can have fewer than three (3) and more than three (3) pFET nanosheets 130 and remain within the scope of the present disclosure.

The pFET silicide layer 172 electrically connects the pFET contact structure 146 to the pFET section 104 and provides electrical communication therethrough between the pFET section 104 and the lowermost metal interconnect layer 124. The intercontact dielectric-filled trench 118 vertically overlays a portion of the pFET contact structure 146. A portion of the dielectric-filled trench 118 vertically overlaid by the pFET local interconnect structure 174. The pFET local interconnect structure 174 electrically connects the pFET metal-filled via 176 with the pFET contact structure 146, and includes an upper surface that contacts the pFET metal-filled via 176 to provide electrical communication between the pFET section 104 and the lowermost metal interconnect layer 124. The pFET metal-filled via 176 is in turn vertically overlaid by the lowermost metal interconnect layer 124, thereby establishing electrical connectivity to the pFET section 104. It is contemplated that the lowermost metal interconnect layer 124 can provide electrical communication to pFET section 104 through the pFET local interconnect structure 174 and the pFET contact structure 146 to one or more upper metal interconnect layers (not shown) for interconnects one or more additional transistors, the lowermost metal interconnect layer 124 thereby integrating the semiconductor device 100 within a VLSI device architecture.

The gate structures 108 are arranged vertically between an inter-layer dielectric (ILD)132 enclosing the pFET metal-filled via 176 and the lowermost metal interconnect layer 124 and the pFET section 104. Although shown and described herein as having three (3) gate structures 108 it is to be understood and appreciated that semiconductor devices having fewer than three (3) gate structures 108 or more than three (3) gate structures 108 can also benefit from the present disclosure.

Still referring to FIG. 2 and FIG. 3, the semiconductor device 100 also includes one or more shallow-trench isolation (STI) oxide structures 134 and 136 (shown in FIG. 3), and one or more lower interlayer dielectric (ILD) structures 138 and 140 (shown in FIG. 3). The semiconductor device 100 additionally includes one or more intermediate ILD structures 142 and 144 (shown in FIG. 3), an nFET contact structure 116, and an nFET local interconnect structure 120.

As shown in FIG. 3, for example, the STI oxide structure 134 is arranged within the semiconductor substrate 110, is below the bottom dielectric isolation layer 112, and is laterally offset from the pFET section 104 in a direction laterally opposite the nFET section 102. The lower ILD structure 138 vertically overlaps the STI oxide structure 134 and is laterally offset from the pFET section 104 in a direction laterally opposite the nFET section 102. The intermediate ILD structure 142 overlaps the lower ILD structure 138 and is laterally offset from both the pFET section 104 and the pFET contact structure 146 in a direction laterally opposite the nFET section 102. It is contemplated that the pFET intermediate ILD structure 142 vertically connects the ILD 132 to the pFET lower ILD structure 138.

The STI oxide structure 136 is arranged within the semiconductor substrate 110, is vertically below the bottom dielectric isolation layer 112, and is laterally offset from the nFET section 102 in a direction laterally opposite the nFET section 102 in a direction opposite the pFET section 104. The lower ILD structure 140 vertically overlaps the STI oxide structure 136 and is also laterally offset from the nFET section 102 in a direction laterally opposite the pFET section 104. The intermediate ILD structure 144 vertically overlaps the lower ILD structure 140 and is laterally offset from both the nFET section 102 and the nFET contact structure 116 in a direction laterally opposite the pFET section 104. It is contemplated that the intermediate ILD structure 144 vertically connect the ILD 132 to the lower ILD structure 140.

The nFET section 102 is similar to the pFET section 104 In further respects the nFET section 102 is laterally offset from the pFET section 104, is spaced apart from the pFET section 104 by an "N2P" space 154. The "N2P" space is occupied by insulator pillar 106 and electrically separates the pFET section 104 from the nFET section 102. Although shown and described herein as having three (3) pFET nanosheets 130, it is to be understood and appreciated that semiconductor devices having fewer than three (3) pFET nanosheets or more than three (3) nanosheets can also benefit from the present disclosure.

As shown in FIG. 3, the insulator pillar 106 extends vertically from the semiconductor substrate 110 to the intercontact dielectric-filled trench 118, bisects the bottom dielectric isolation layer 112, and has a topmost surface 156. The topmost surface 156 of the insulator pillar 106 is arranged between the pFET section 104 and the nFET section 102. The topmost surface 156 of the insulator pillar 106 is also arranged vertically above both the pFET section 104 and the nFET section 102. Accordingly, the insulator pillar establishes separation of the pFET section 104 and the nFET section by a thin width. In certain examples the insulator pillar 106 has a pillar lateral width 158 that is about ten (10) nanometers or less. In accordance with certain examples the pillar lateral width 158 is about eight (8) nanometers or less.

Still referring to FIG. 3, the nFET contact structure 116 wraps about the nFET section 102 below the topmost surface 156 of the insulator pillar 106 and provides electrical communication between the nFET section 102 and the lowermost metal interconnect layer 124. In this respect the nFET contact structure 116 has an nFET contact structure vertical portion 160, an nFET contact structure horizontal portion 162, and an nFET contact structure tapered portion 164. The nFET contact structure vertical portion 160 is laterally adjacent to the nFET section 102, is in electrical communication with the nFET section 102 through the nFET silicide layer 114, laterally spaced apart from the insulator pillar 106 by the pFET section 104 and is further connected to the nFET contact structure horizontal portion 162. In certain examples the nFET contact structure vertical portion 160 abuts the nFET section 102 via the nFET silicide layer 114.

The nFET contact structure horizontal portion 162 is vertically adjacent to the nFET section 102, is in electrical communication with the nFET section 102 through the nFET silicide layer 114 and extends laterally from the insulator pillar 106 to the nFET contact structure vertical portion 160. In certain examples the nFET contact structure horizontal portion 162 abuts the nFET section 102 via the nFET silicide layer 114. As will be appreciated by those of skill in the art in view of the present disclosure, the nFET contact structure vertical portion 160 and the nFET contact structure horizontal portion 162 cooperate to increase area of the electrical interface between the nFET contact structure 116 and the nFET section 102, reducing electrical resistance between the nFET section 102 and the nFET contact structure 116.

The nFET contact structure tapered portion 164 connects the nFET contact structure horizontal portion 162, and electrically therethrough the nFET contact structure vertical portion 160, to the nFET local interconnect structure 120. FIG. 2 shows the nFET local interconnect 120 formed between the top portion of the gate structures 108, each which have a gate cap 109 formed thereon. FIG. 3 shows the nFET local interconnect structure 120 extending laterally from the nFET contact structure tapered portion 164 in a direction laterally away from the insulator pillar 106. Accordingly, the nFET local interconnect structure 120 contacts the nFET metal-filled via 122, and provides electrical communication between the lowermost metal interconnect layer 124 and the nFET contact structure 116. As will be appreciated by those of skill in the art in view of the present disclosure, laterally positioning the nFET local interconnect structure 120 on a side of the nFET contact structure 116 laterally opposite the insulator pillar 106 increases electrical separation between currents flowing through the nFET contact structure 116 and the pFET contact structure 146, improving R/C performance of the semiconductor device 100.

Although the cross-sectional view of FIG. 2 shows the nFET section 102 in detail, the pFET section 104 has a similar structure. For example, the pFET contact structure 146 wraps about the pFET section 104 below the topmost surface 156 of the insulator pillar 106 and provides electrical communication between the pFET section 104 and the lowermost metal interconnect layer 124. In this respect the pFET contact structure 146 has a pFET contact structure vertical portion 166, a pFET contact structure horizontal portion 168, and a pFET contact structure tapered portion 170. The pFET contact structure vertical portion 166 is laterally adjacent to the pFET section 104, is in electrical communication with the pFET section 104 through a pFET silicide layer 172, is laterally spaced apart from the insulator pillar 106 by the pFET section 104 and is further connected to the pFET contact structure horizontal portion 168. In certain examples the pFET contact structure vertical portion 166 abuts the pFET section 104 via the pFET silicide layer 172.

The pFET contact structure horizontal portion 168 is vertically adjacent to the pFET section 104, is in electrical communication with the pFET section 104 through the pFET silicide layer 172 and extends laterally from the insulator pillar 106 to the pFET contact structure vertical portion 166. In certain examples the pFET contact structure horizontal portion 168 abuts the pFET section 104 via the pFET silicide layer 172. As will be appreciated by those of skill in the art in view of the present disclosure, the pFET contact structure vertical portion 166 and the pFET contact structure horizontal portion 168 cooperate to increase area of the electrical interface between the pFET contact structure 146 and the pFET section 104, reducing electrical resistance between the pFET section 104 and the pFET contact structure 146.

The pFET contact structure tapered portion 170 connects the pFET contact structure horizontal portion 168, and electrically therethrough the pFET contact structure vertical portion 166, to a pFET local interconnect structure 174. The pFET local interconnect 174 is formed between the top portion of the gate structures 108, each which have a gate cap 109 formed thereon. As shown in FIG. 3, the pFET local interconnect structure 174 also extends laterally from the pFET contact structure tapered portion 170 in a direction laterally toward the insulator pillar 106. Accordingly, the pFET local interconnect structure 174 contacts the pFET metal-filled via 176, and provides electrical communication between the lowermost metal interconnect layer 124 and the pFET contact structure 146.

The intercontact dielectric-filled trench 118 extends laterally between the pFET contact structure 146 and the nFET contact structure 116. The intercontact dielectric-filled trench 118 also extends vertically between the horizontal portions 162/168 and the ILD 132. Accordingly, the pFET contact structure 146, nFET contact structure 116 and the topmost surface 156 of the insulator pillar 106 are embedded in the intercontact dielectric-filled trench 118.

Figure 10:
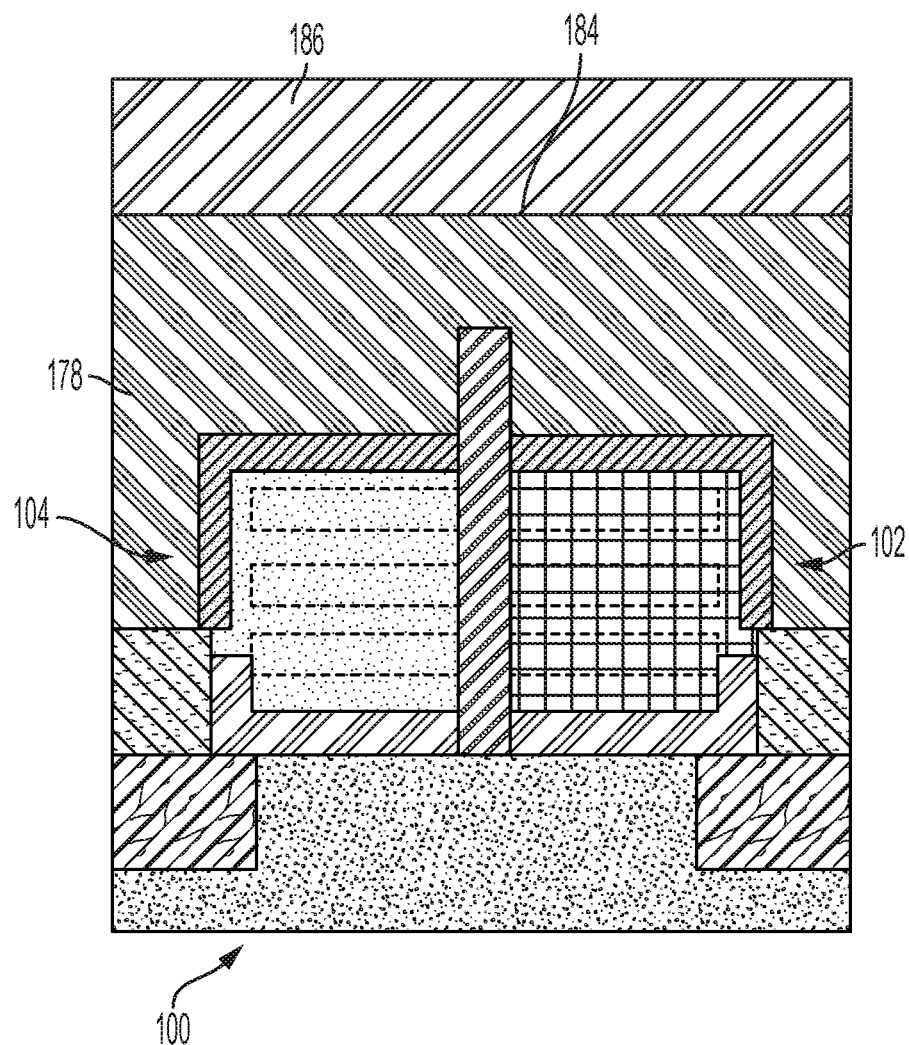
FIG. 10 depicts a cross-sectional view of the semiconductor device along the line Y of FIG. 1 after a processing operation according to one or more embodiments of the invention.
Figure 11:
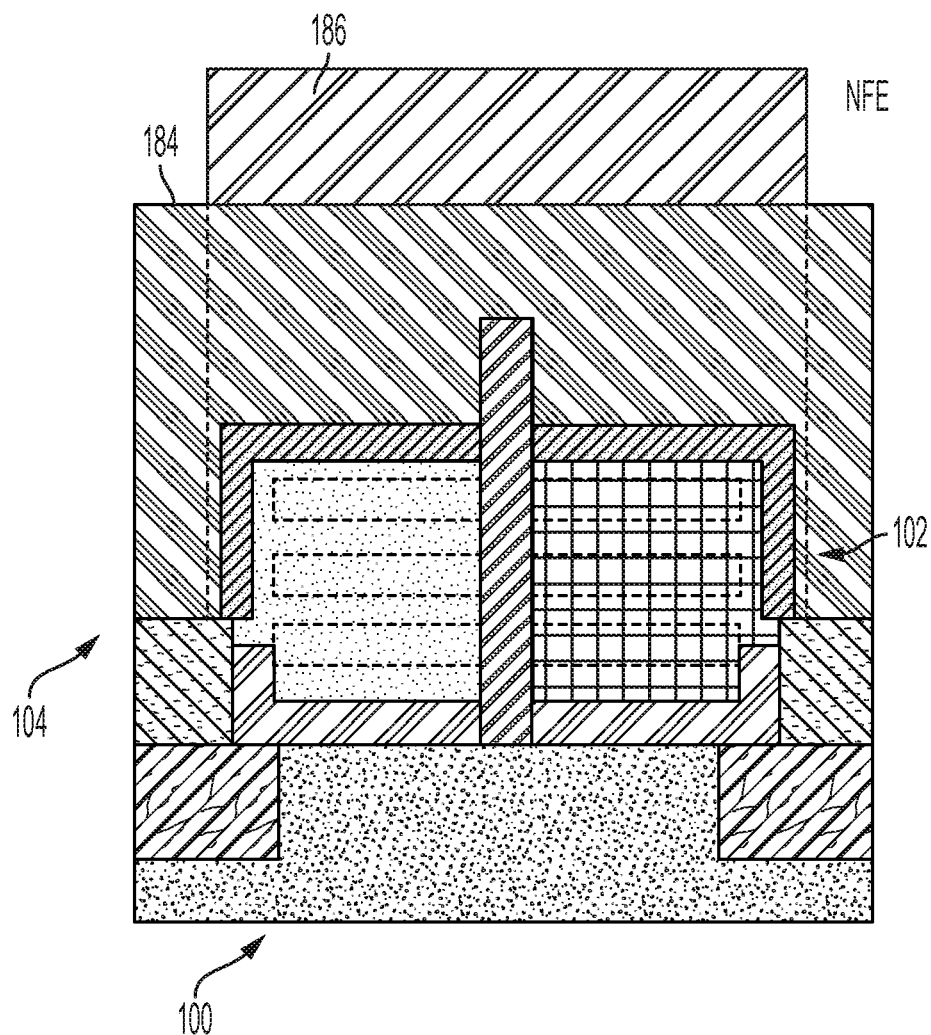
FIG. 11 depicts a cross-sectional view of the semiconductor device along the line Y of FIG. 1 after a processing operation according to one or more embodiments of the invention.
Figure 12:
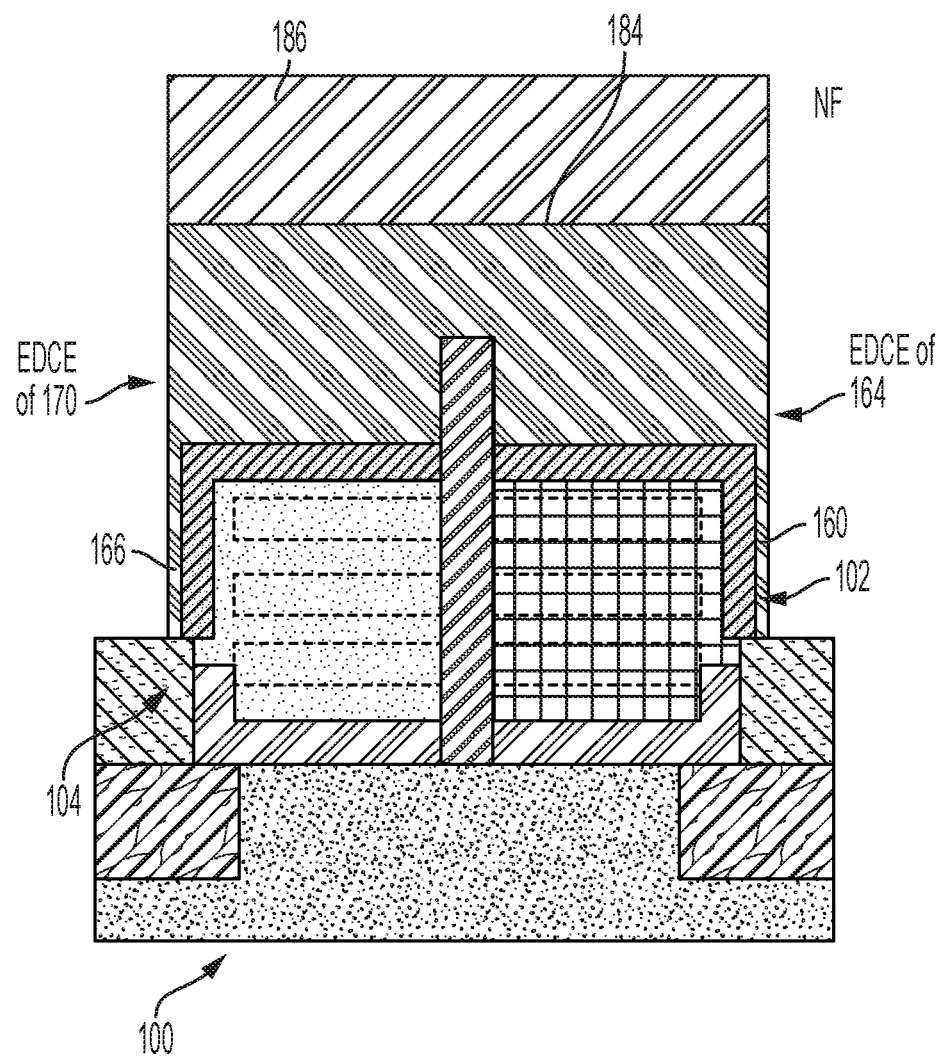
FIG. 12 depicts a cross-sectional view of the semiconductor device along the line Y of FIG. 1 after a processing operation according to one or more embodiments of the invention.
Figure 17:
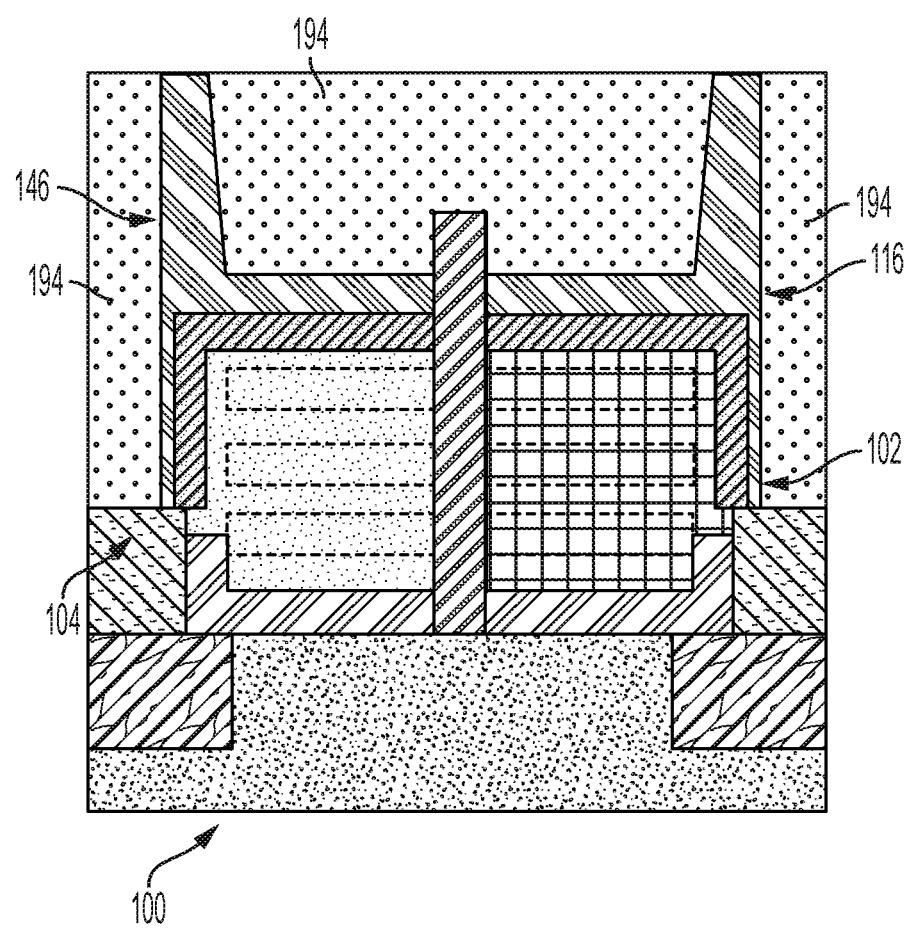
FIG. 17 depicts a cross-sectional view of the semiconductor device along the line Y of FIG. 1 after a processing operation according to one or more embodiments of the invention.
Figure 18:
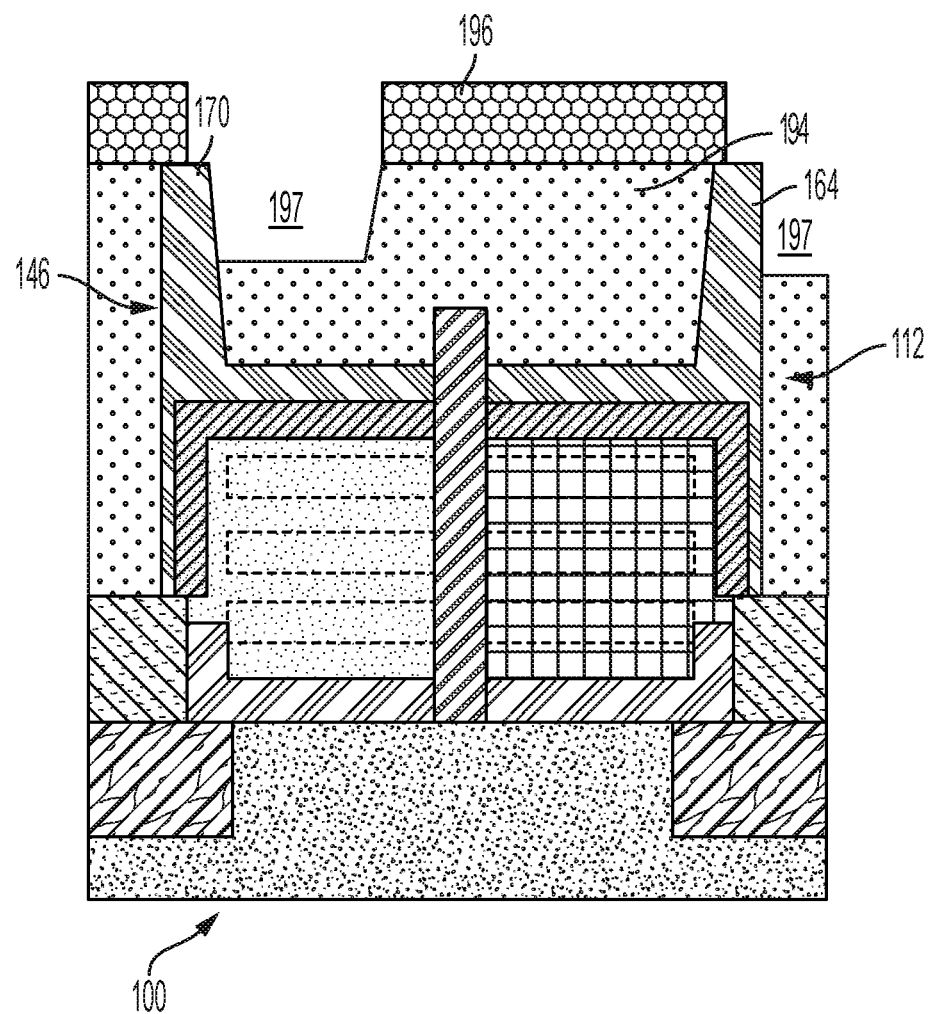
FIG. 18 depicts a cross-sectional view of the semiconductor device along the line Y of FIG. 1 after a processing operation according to one or more embodiments of the invention.
Figure 19:
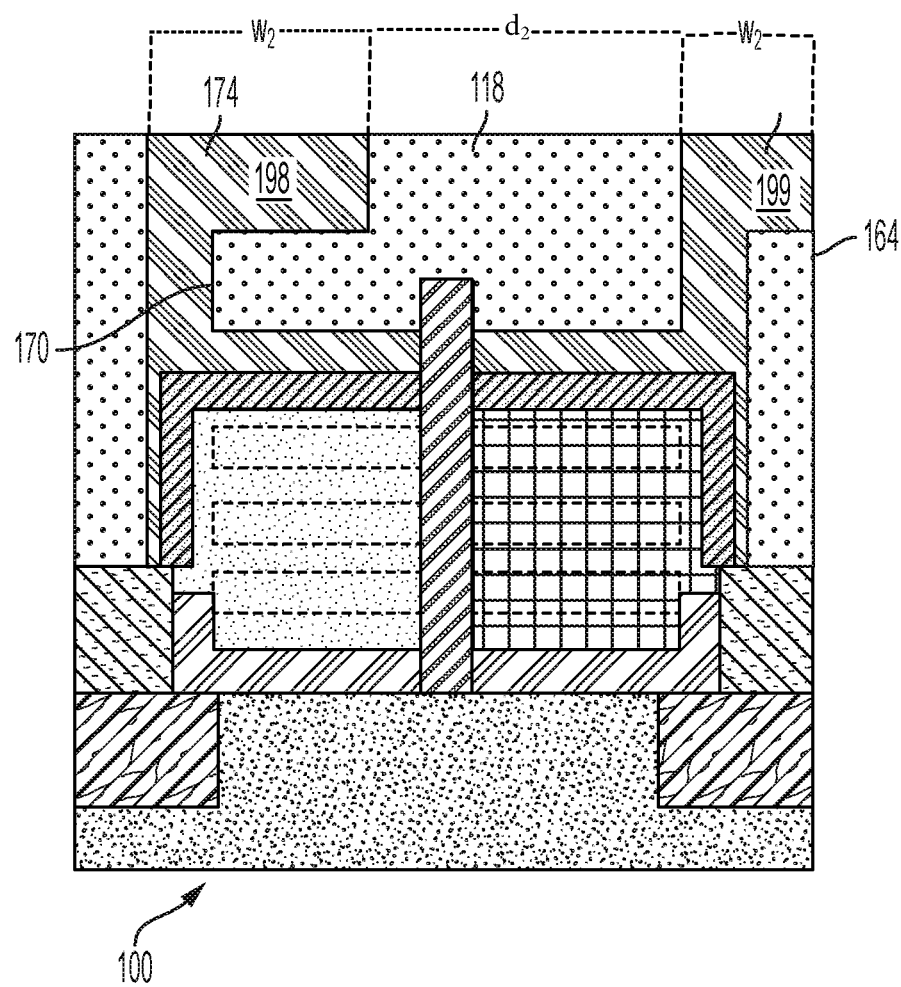
FIG. 19 depicts a cross-sectional view of the semiconductor device along the line Y of FIG. 1 after a processing operation according to one or more embodiments of the invention.

Referring now to FIGS. 4-18, the semiconductor device 100 is depicted undergoing operations to fabricate the semiconductor device 100. FIGS. 4-9 show operations for depositing a metal coating 178 (shown in FIGS. 8 and 9) for fabricating the pFET contact structure 146 (shown in FIG. 3) and the nFET contact structure 116 (shown in FIG. 3). FIGS. 10-12 show operations for fabricating the pFET contact structure vertical portion 166 (shown in FIG. 3) and the nFET contact structure vertical portion 160 (shown in FIG. 3) on the semiconductor device 100 from the metal coating 178. FIGS. 13-16 show operations for fabricating the pFET contact structure horizontal portion 168 (shown in FIG. 3), the pFET contact structure tapered portion 170 (shown in FIG. 3), the nFET contact structure horizontal portion 162 (shown in FIG. 3), and the nFET contact structure tapered portion 164 (shown in FIG. 3) on the semiconductor device 100 from the metal coating 178. FIGS. 17-19 show operations for fabricating the pFET local interconnect structure 174 (shown in FIG. 2) and the nFET local interconnect structure 120 (shown in FIG. 3) in the semiconductor device 100.

Figure 4:
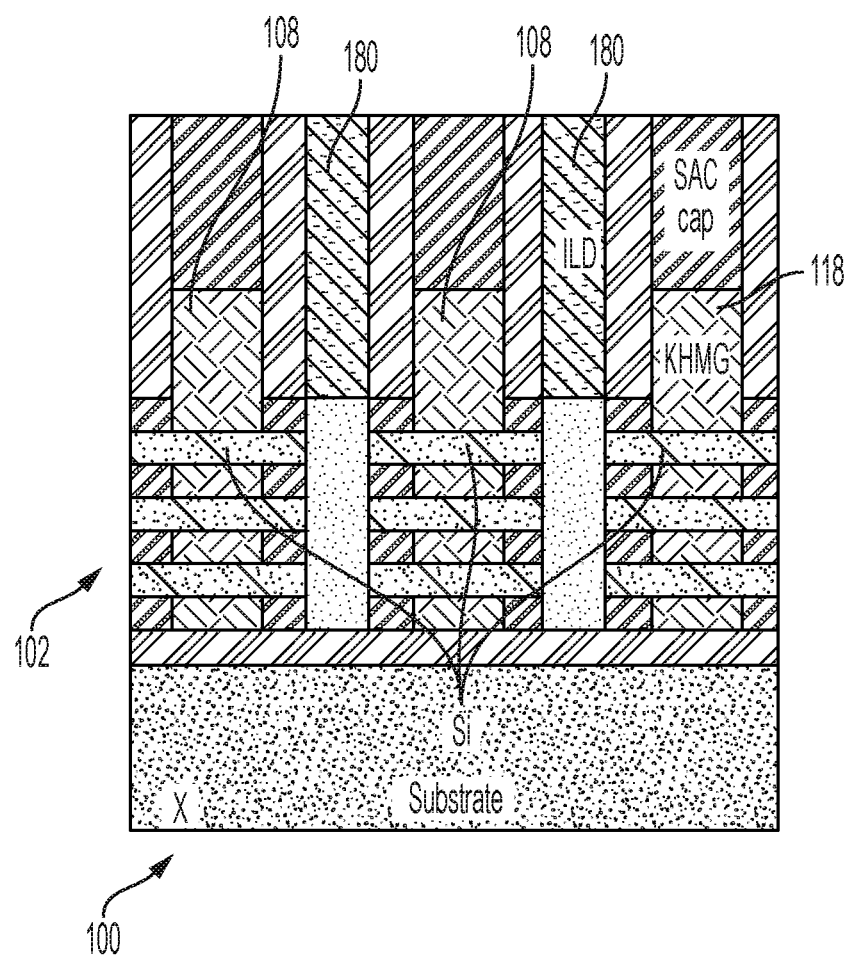
FIG. 4 depicts a cross-sectional view of the semiconductor device along the line X of FIG. 1 after a processing operation according to one or more embodiments of the invention.
Figure 5:
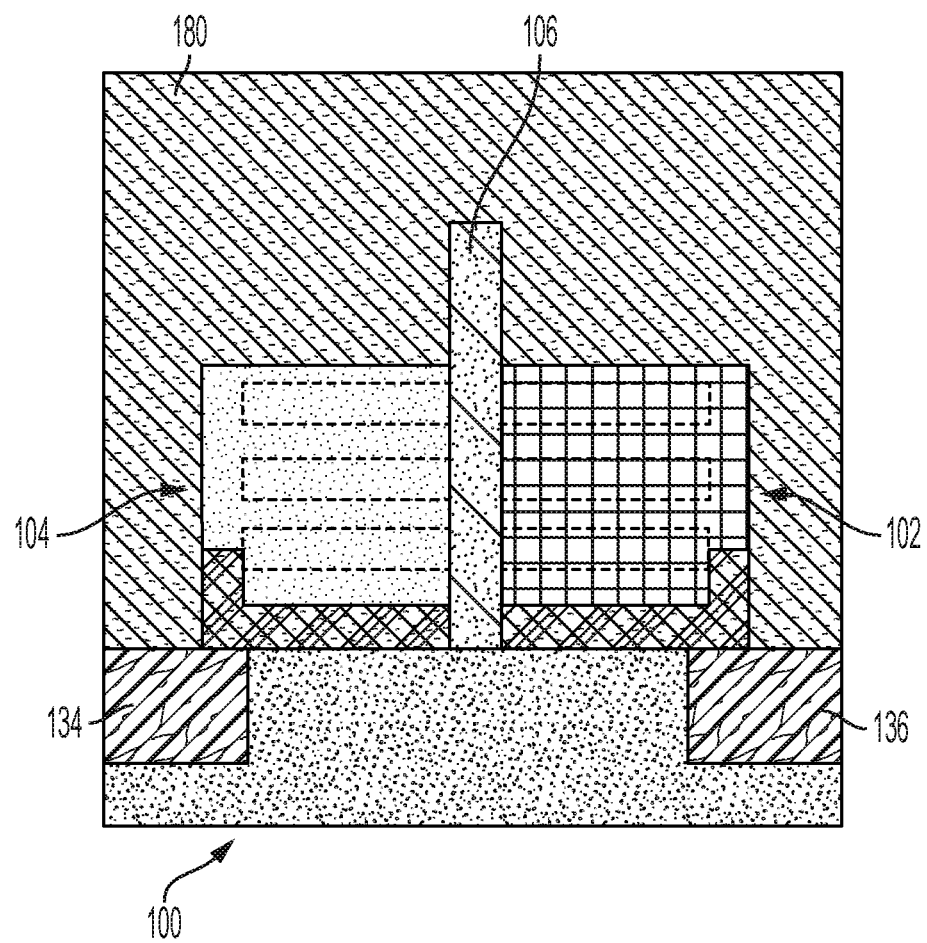
FIG. 5 depicts a cross-sectional view of the semiconductor device along the line Y of FIG. 1 after a processing operation according to one or more embodiments of the invention.
Figure 6:
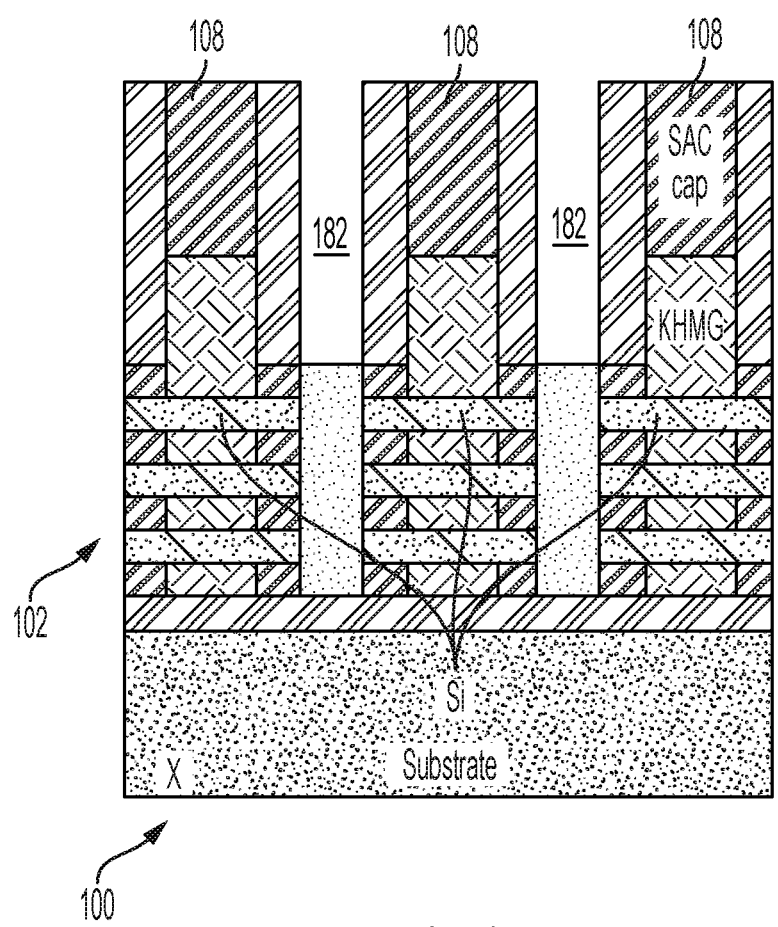
FIG. 6 depicts a cross-sectional view of the semiconductor device along the line X of FIG. 1 after a processing operation according to one or more embodiments of the invention.
Figure 7:
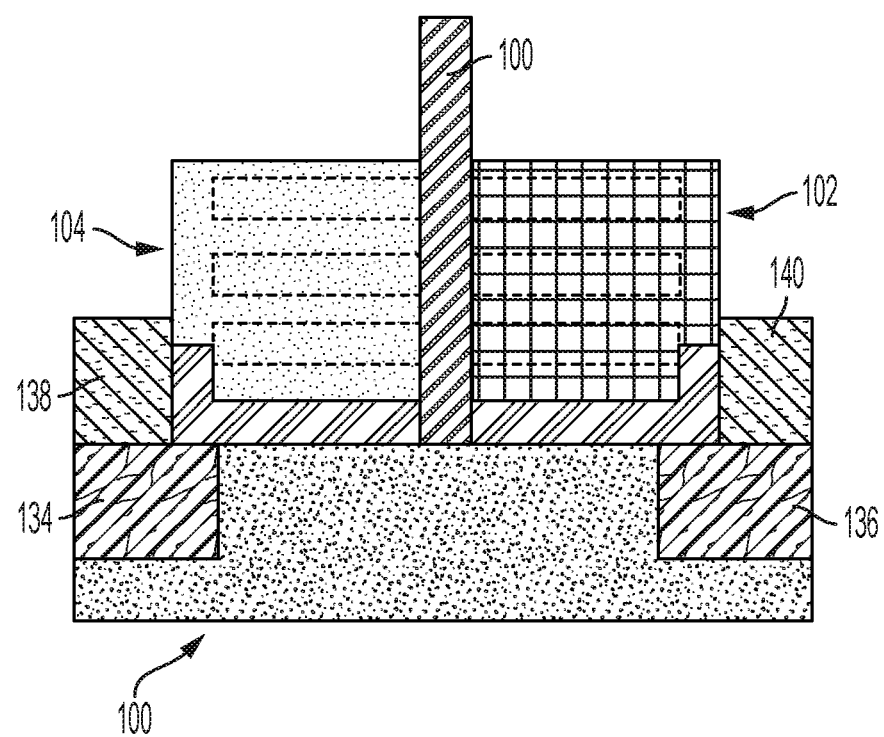
FIG. 7 depicts a cross-sectional view of the semiconductor device along the line Y of FIG. 1 after a processing operation according to one or more embodiments of the invention.

With reference to FIGS. 4-9, known fabrication techniques have been used to fabricate the nFET section 102, the pFET section 104, and the insulator pillar 106. Known fabrication techniques have also been used to fabricate the STI oxide structures 134 and 136 (shown in FIG. 5). As shown in FIGS. 4 and 5, an ILD coating 180 is deposited on the semiconductor device 100. More specifically, the ILD coating 180 is deposited between the gate structures 108 (as shown in FIG. 4). The ILD coating 180 is further deposited over the oxide structures 134 and 136, the pFET section 104, and the nFET section 102. As shown in FIG. 6, the ILD coating 180 is recessed from interstitial spaces 182 defined between the gate structures 108. As shown in FIG. 7, the ILD coating 180 is also removed from above the pFET section 104 and the nFET section 102. The ILD coating 180 is further recessed at locations laterally offset from the pFET section 104 and the pFET section 104 to form the pFET lower ILD structure 138 and the nFET lower ILD structure, respectively. Removal and recess of the ILD coating 180 can be done, for example, utilizing a wet etch operation.

Figure 8:
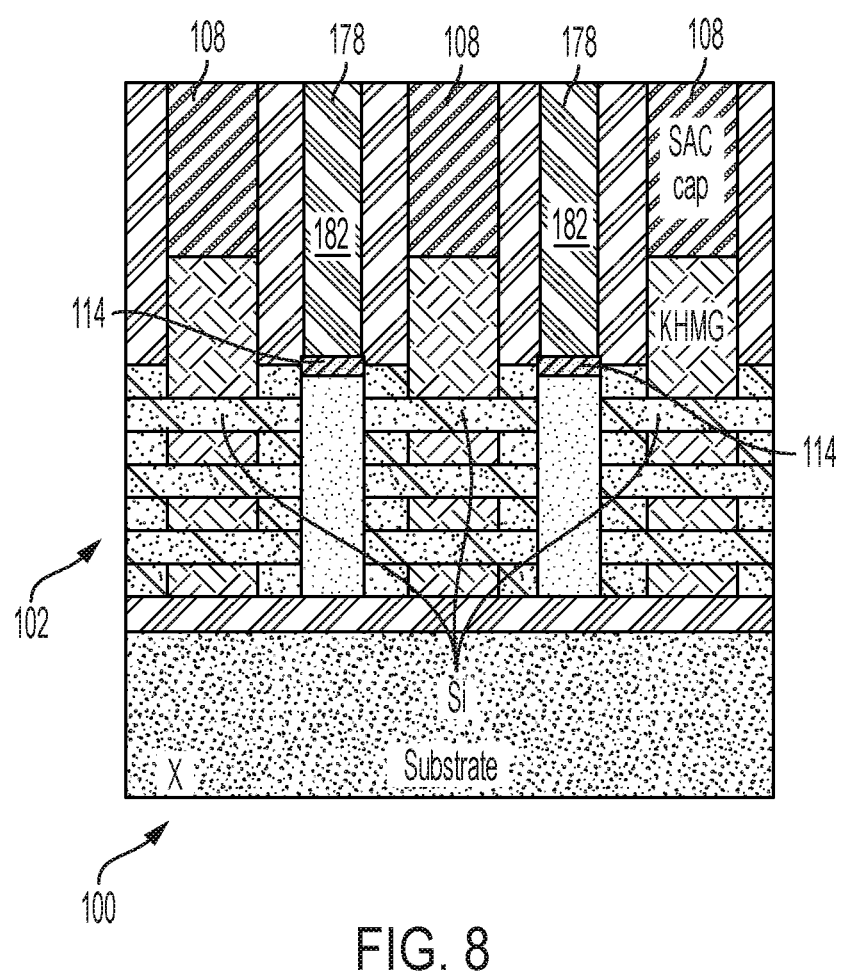
FIG. 8 depicts a cross-sectional view of the semiconductor device along the line X of FIG. 1 after a processing operation according to one or more embodiments of the invention.
Figure 9:
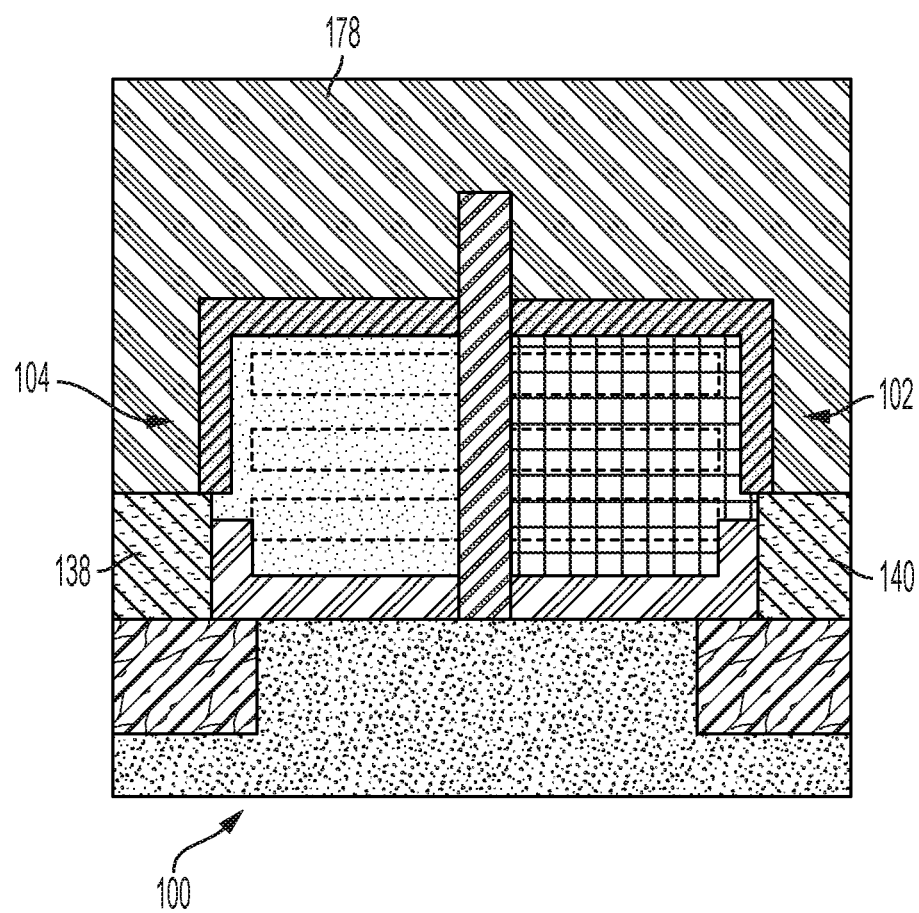
FIG. 9 depicts a cross-sectional view of the semiconductor device along the line X of FIG. 1 after a processing operation according to one or more embodiments of the invention.

As shown in FIGS. 8 and 9, a metal coating 178 is applied to the semiconductor device 100. Specifically, as shown in FIG. 8, the metal coating 178 is deposited within the interstitial spaces 182 between the gate structures 108 and over the pFET section 104 and the nFET section 102. As shown in FIG. 9, the metal coating 178 is deposited such that it overlays both the pFET lower ILD structure 138 and the nFET lower ILD structure 140. In one or more embodiments of the invention, the metal coating 178 completely covers the upper surface and exposed sidewall of both the pFET section 104 and nFET section 102. In this manner, the metal coating 178 can serve to increase the contact area on the pFET section 104 and the nFET section 102, thereby reducing the overall resistance of the completed interconnect structures 170 and 120 discussed in greater detail below. In one or more embodiments of the invention, the metal coating 178 includes, for example, ruthenium (Ru) or tungsten (W), and the width (i.e., lower contact width) of the metal coating 178 covering the upper surface of the pFET section 104 and nFET section 102 ranges, for example, from about 30 nm to about 130 nm. As also shown in FIGS. 8 and 9, known operations are also performed to form the pFET silicide layer 172 over the pFET section 104 and the nFET silicide layer 114.

With reference to FIGS. 10-12, the metal coating 178 is planarized to define a metal surface 184 suitable for patterning and a sacrificial hardmask 186 (such as TiOx, or AlOx) is deposited on the metal surface 184. As shown in FIG. 11, the resist coating 186 is patterned (e.g., using known lithography techniques) such that portions of the metal surface 184 are exposed which terminate at edges of the pFET contact structure vertical portion 166 (shown in FIG. 3) and a portion of the pFET contact structure tapered portion 170 (shown in FIG. 3), and the nFET contact structure vertical portion 160 (shown in FIG. 3) and a portion of the nFET contact structure tapered portion 164 (shown in FIG. 3). As shown in FIG. 12, portions of the metal coating 178 are removed by performing an etch operation that utilizes the resist coating 186 to define the pFET contact structure vertical portion 166 (shown in FIG. 3) and the portion of the pFET contact structure tapered portion 170 (shown in FIG. 3), and the nFET contact structure vertical portion 160 (shown in FIG. 3) and the portion of the nFET contact structure tapered portion 164 (shown in FIG. 3).

Figure 13:
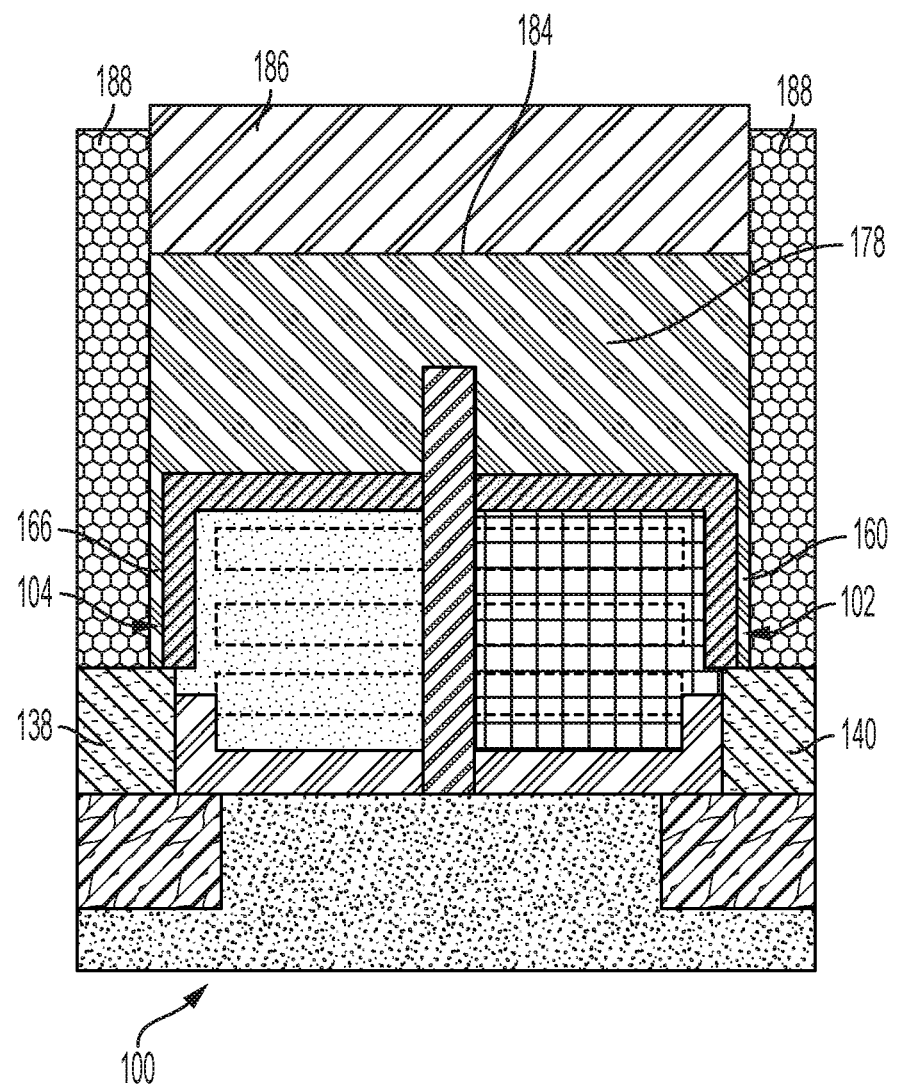
FIG. 13 depicts a cross-sectional view of the semiconductor device along the line Y of FIG. 1 after a processing operation according to one or more embodiments of the invention.
Figure 14:
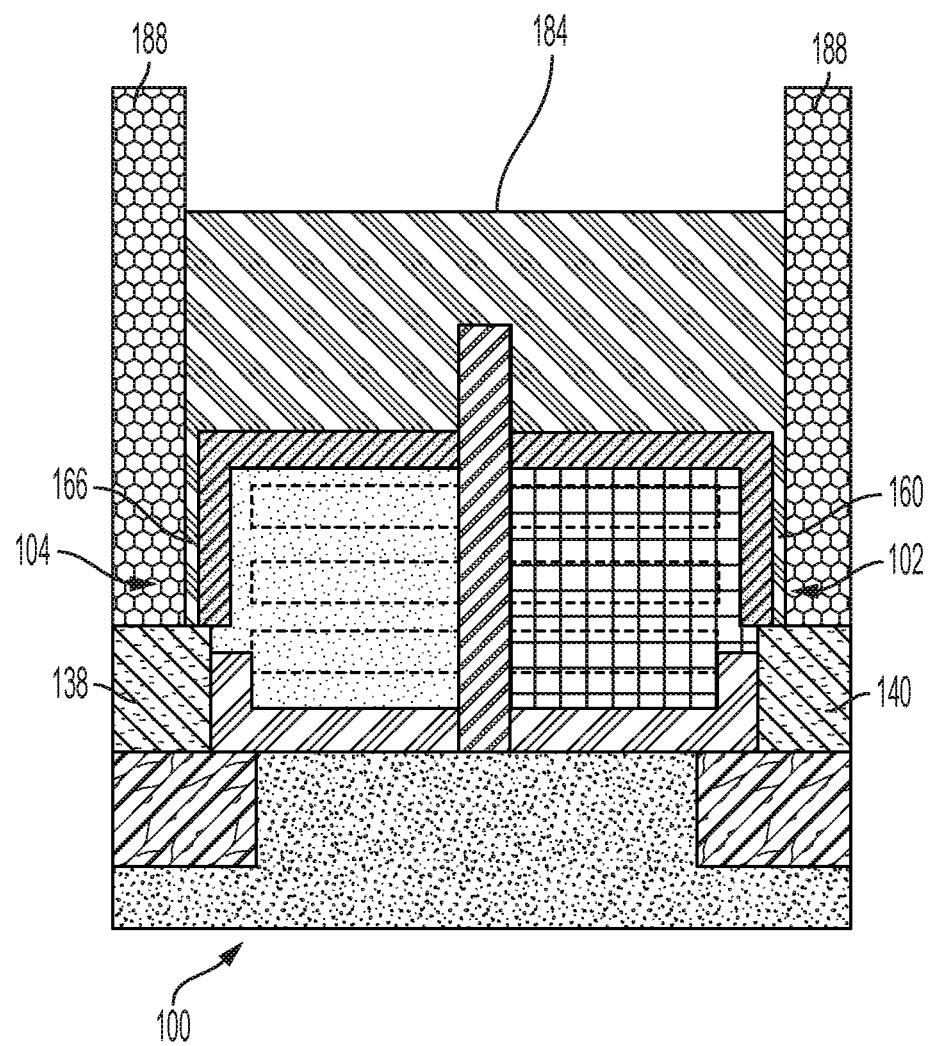
FIG. 14 depicts a cross-sectional view of the semiconductor device along the line Y of FIG. 1 after a processing operation according to one or more embodiments of the invention.
Figure 15:
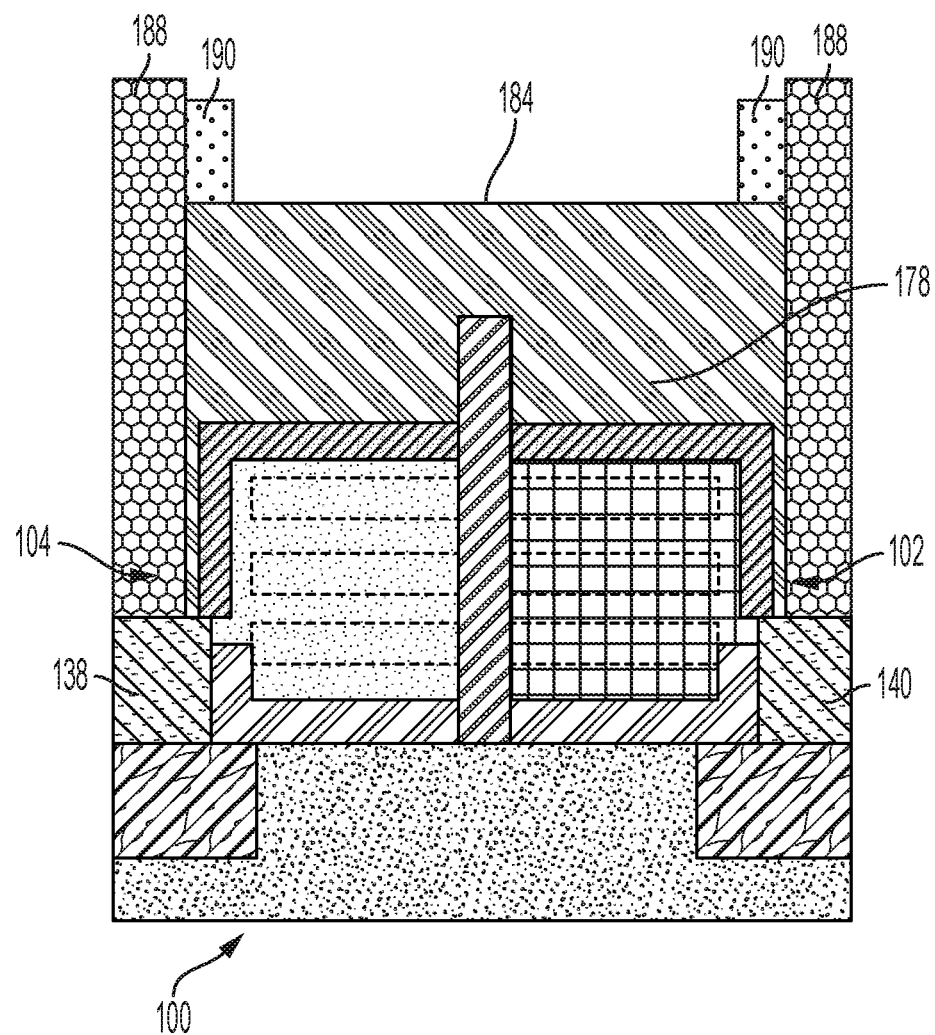
FIG. 15 depicts a cross-sectional view of the semiconductor device along the line Y of FIG. 1 after a processing operation according to one or more embodiments of the invention.
Figure 16:
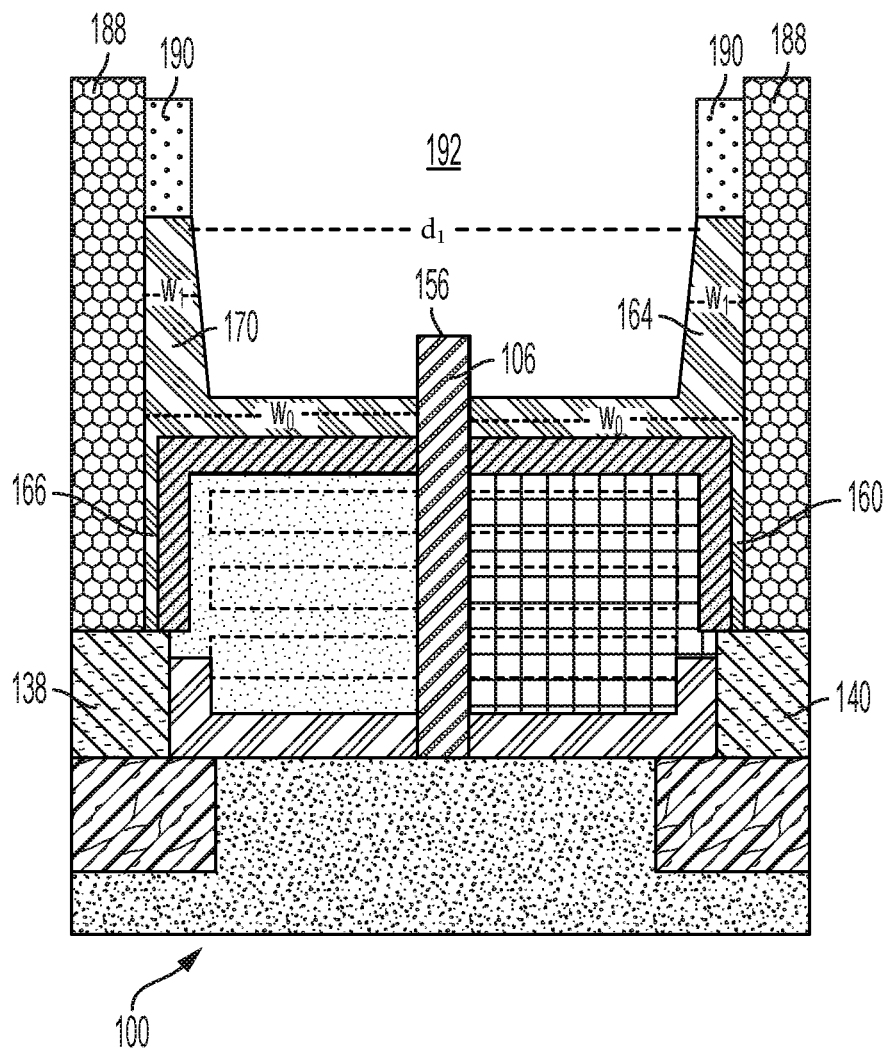
FIG. 16 depicts a cross-sectional view of the semiconductor device along the line Y of FIG. 1 after a processing operation according to one or more embodiments of the invention.

With reference to FIGS. 13-16, organic planarization layer (OPL) depositions 188 are emplaced on laterally opposite sides of the semiconductor device 100. The OPL can include various organic polymers, or the oxide material can be spin on oxide or flowable oxide. As shown in FIG. 13, the OPL depositions 188 are deposited over the pFET lower ILD structure 138 and the nFET lower ILD structure 140 at locations adjacent to the pFET contact structure vertical portion 166 and the nFET contact structure vertical portion 160, respectively. In some embodiments of the invention, the OPL can be overfilled to form atop the resist coating 186 and subsequently recessed to as to re-expose the resist coating 186. As shown in FIGS. 14 and 15, the sacrificial hardmaks 186 is then removed from the metal coating 178 using an etching processes selective to the OPL 188 and the spacers 190. IN this manner, the metal surface 184 and spacers 190 (shown in FIG. 15) are emplaced at laterally inner faces of the OPL depositions 188.

The metal coating 178 is then etched selective to the insulator pillar 106. In one or more embodiments of the invention, the metal coating 178 is recessed to a level below the topmost surface 156 of the insulator pillar 106 to define the pFET contact structure horizontal portion 168 and the nFET contact structure horizontal portion 162, as shown in FIG. 16. Various etching processes selective to the material of the insulator pillar 106 can be performed so as to recess the metal coating 178 without recessing or substantially recessing the insulator pillar 106.

As also shown in FIG. 16, recessing the metal coating 178 also forms an inter-contact trench 192 that defines of the pFET contact structure tapered portion 170 and the opposing nFET contact structure tapered portion 164. Although described as having a tapered profile, the pFET and nFET contact structure portions 170 and 164 can have a uniform (non-tapered) profile in some embodiments of the invention without departing from the scope of the invention.

The pFET contact structure tapered portion 170 and the opposing nFET contact structure tapered portion 164 are separated from one another by a distance (d1 extending along the Y-axis), and are electrically isolated from one another by the insulator pillar 106 interposed therebetween. In one or more non-limiting embodiments of the invention, the distance (d1) is greater than the widths (w1 extending along the Y-axis) of each of the pFET contact structure tapered portion 170 and the nFET contact structure tapered portion 164. In one or more embodiments of the invention, the distance (d1) can range for example, from about 40 nm to about 180 nm, and the widths (w1) can range, for example, from about 10 nm to about 50 nm. The larger distance (d1) between the pFET contact structure tapered portion 170 and the nFET contact structure tapered portion 164 serves to reduce overall parasitic capacitance between the contact structures 116/146 and gate structures 108 of the semiconductor device 100.

With reference to FIGS. 17-19, operations to form the pFET local interconnect structure 174 (shown in FIG. 3) and nFET local interconnect structure 120 (shown in FIG. 3) are shown. As shown in FIG. 17, a dielectric coating 194 is deposited over the pFET contact structure 146 and the nFET contact structure 116. As shown in FIG. 18, after the dielectric coating 194 is polished, an OPL layer 196 is deposited over the dielectric coating 194 and the OPL layer 196 patterned to expose a portion of the surface of the dielectric coating 194. The exposed surface of the dielectric coating is the recessed at locations laterally adjacent to the pFET contact structure tapered portion 170 and the nFET contact structure tapered portion 164 using an etch technique to form first and second local interconnect recesses 197. As shown in FIG. 19, metal is thereafter deposited in the local interconnect recesses 197. The metal deposited in the interconnect recesses 197 form opposing first-type and second-type upper interconnect portions 198 and 199. The interconnect portions 198 and 199 have a width (w2 extending along the Y-axis) and are separated from one another by a distance (d2 extending along the Y-axis) such that they are electrically isolated from one another by the intercontact dielectric-filled trench 118. In some example embodiments of the invention, the distance (d2) is greater than the width (w2). In one or more embodiments of the invention, the distance (d2) can range, for example, from about 20 nm to about 100 nm, and the widths (w2) can range, for example, from about 20 nm to about 100 nm. The upper interconnect portions 198 and 199 effectively increases the contact area provided to a next-level interconnect structure (e.g., vias 176 and 122). In one or more embodiments of the invention, the width (w2) of the upper interconnect portions 198 and 199 is greater than width (w1) of the contact structure portions 164 and 170.

Figure 20A:
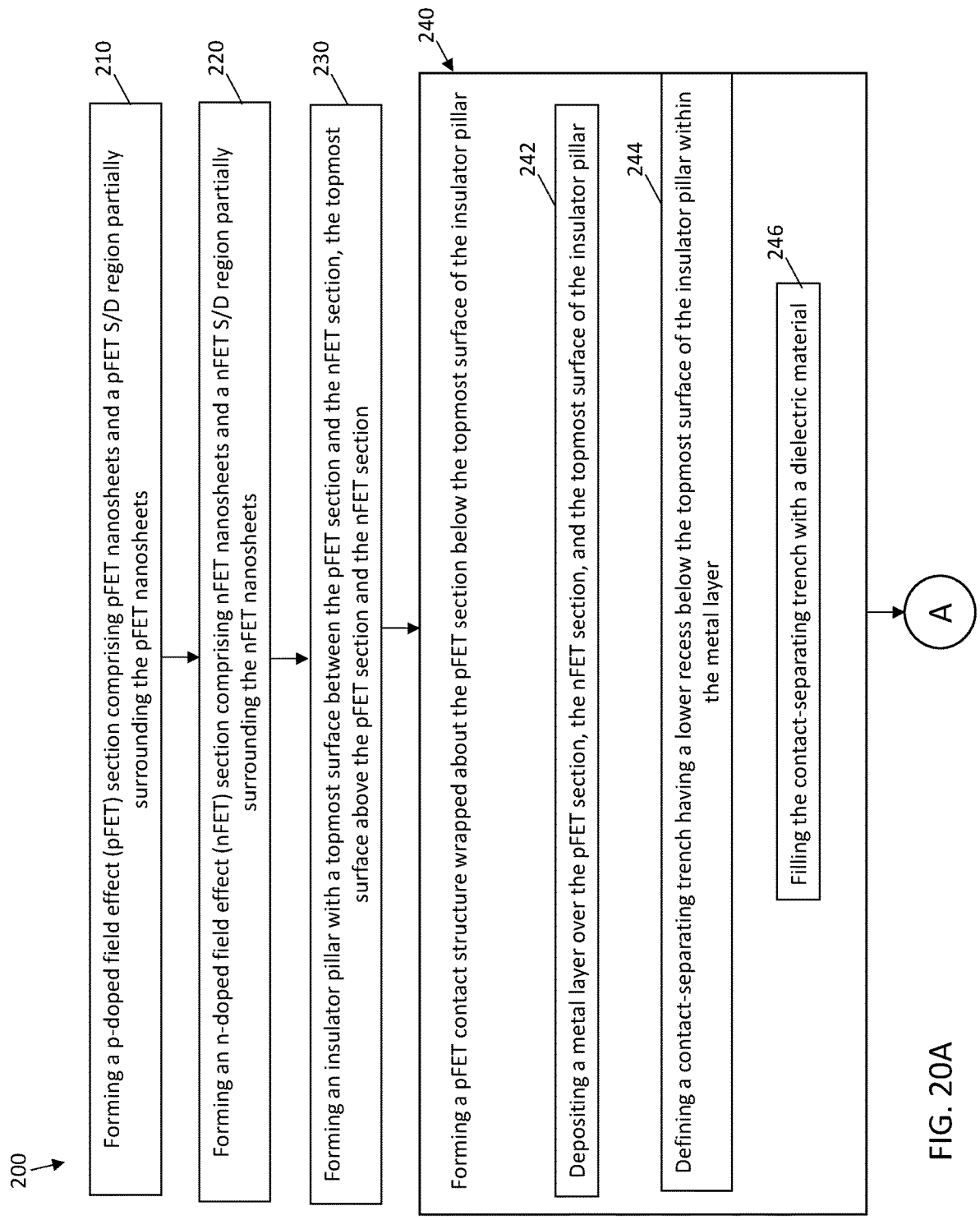
FIG. 20A depicts a portion of a flow diagram illustrating a method according to one or more embodiments of the invention.
Figure 20B:
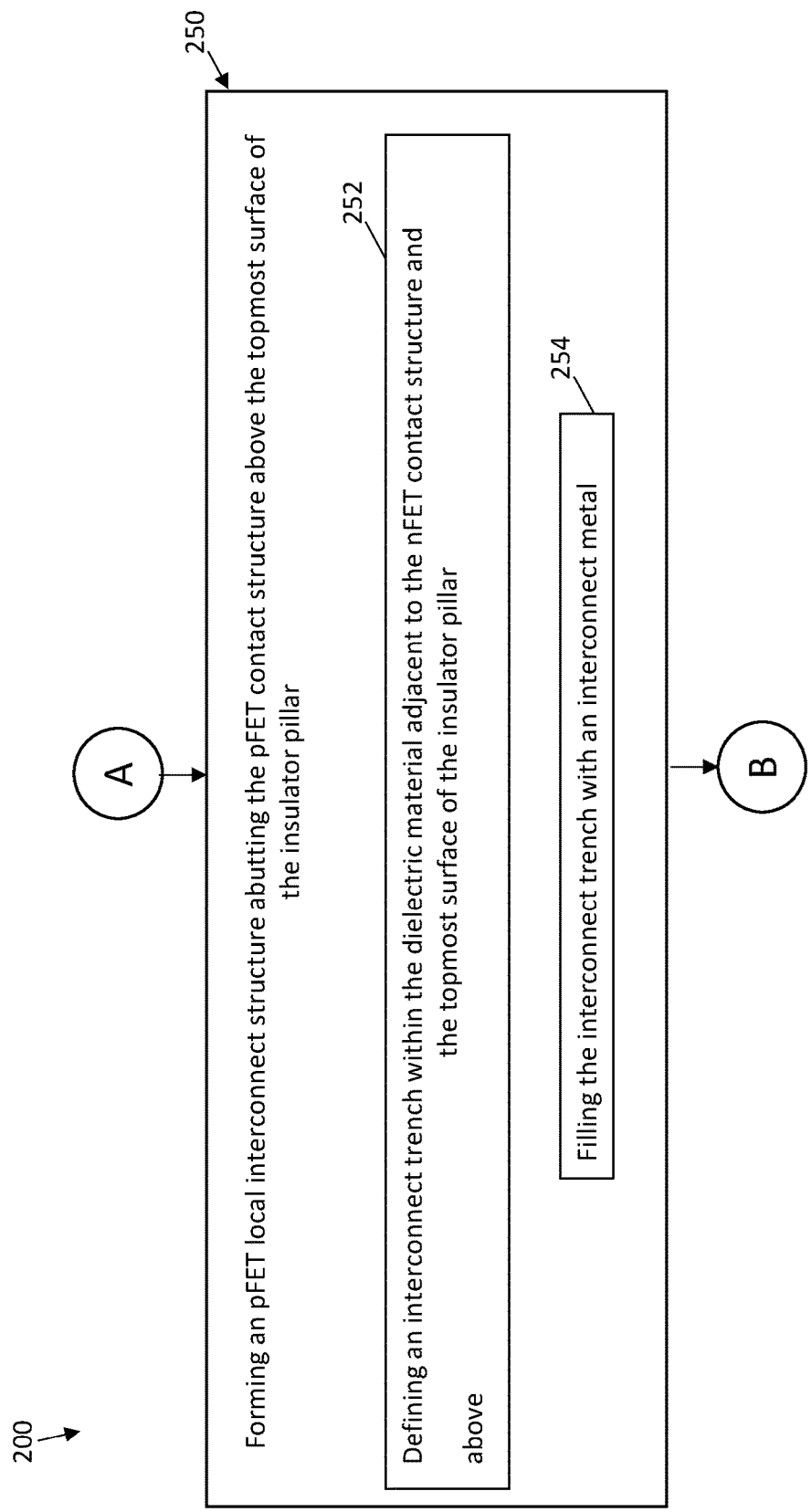
FIG. 20B depicts another portion of the flow diagram shown in FIG. 20A illustrating a method according to one or more embodiments of the invention.
Figure 20C:
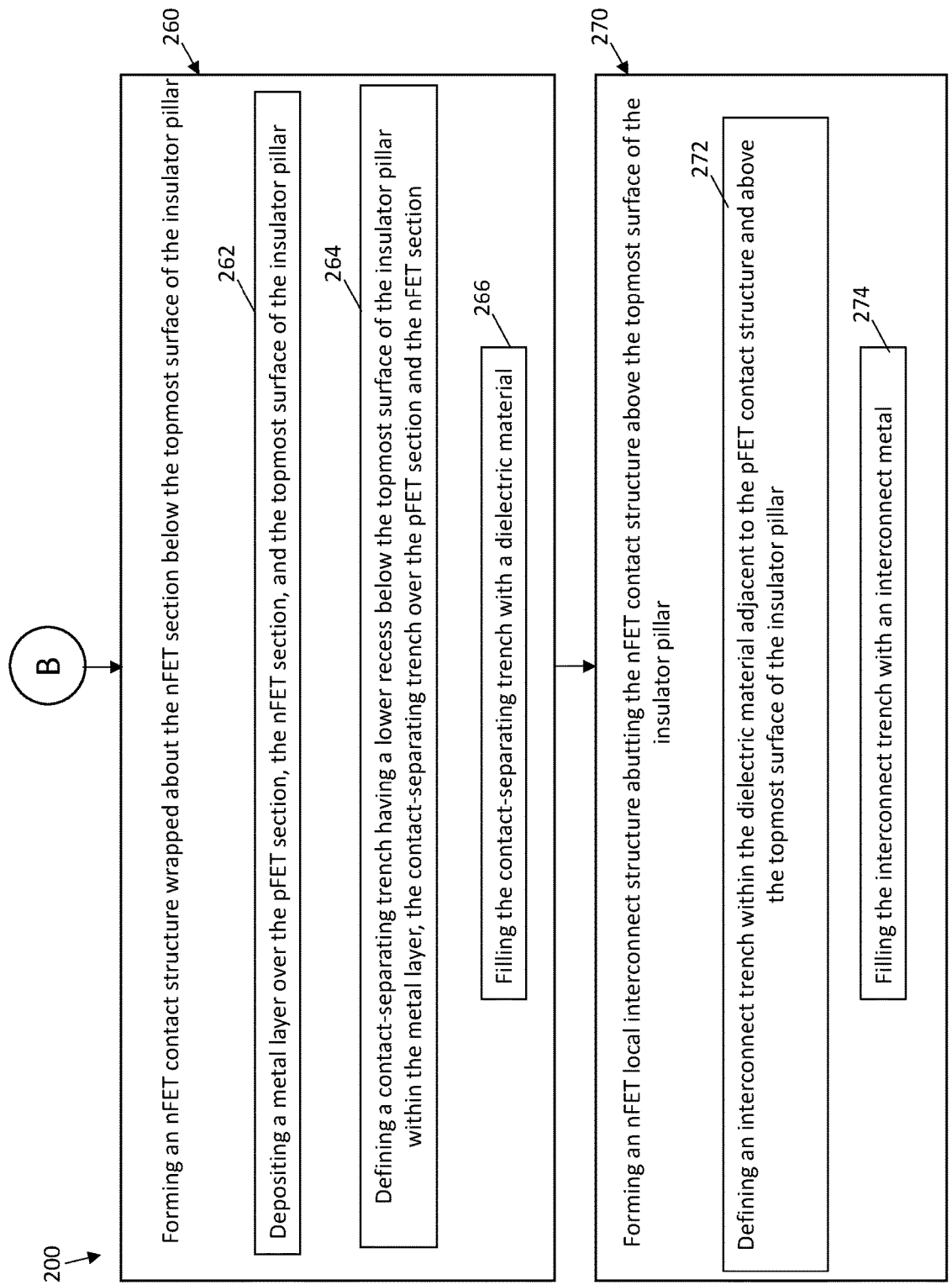
FIG. 20C depicts yet another portion of the flow diagram shown in FIGS. 20A and 20B.

Referring now to FIGS. 20A, 20B and 20C, a method 200 of making a multilayer IC device, e.g., the semiconductor device 100 (shown in FIGS. 1, 2 and 3), is shown according to an illustrative and non-limiting example of the method 200. As shown with box 210, the method 200 includes forming a p-doped field effect transistor (pFET) section including pFET nanosheets and a pFET S/D region partially surrounding the pFET nanosheets, e.g., the pFET section 104 (shown in FIG. 1) including the pFET nanosheets 130 (shown in FIG. 3) and pFET source/drain region 152 (shown in FIG. 3). As described at box 220, the method 200 also includes forming an n-doped field effect transistor (nFET) section including nFET nanosheets and an nFET S/D region partially surrounding the nFET nanosheets, e.g., the nFET section 102 (shown in FIG. 2) include the nFET nanosheets (shown in FIG. 3) and the nFET source/drain region (shown in FIG. 3). The method 200 additionally includes forming an insulator pillar with a topmost surface between the pFET section and the nFET section, e.g., the insulator pillar 106 (shown in FIG. 3) with the topmost surface 156 (shown in FIG. 3), as shown with box 230.

As described at box 240, the method 200 includes forming a pFET contact structure wrapped about the pFET section below the topmost surface of the insulator pillar, e.g., the pFET contact structure 146 (shown in FIG. 3). Forming the pFET contact structure can include depositing a metal layer over the pFET section, the nFET section, and the topmost surface of the insulator pillar, as described at box 242. Forming the pFET contact structure can also include defining a contact-separating trench having a lower recess below the topmost surface of the insulator pillar within the metal layer, as described at box 244. Forming the pFET contact structure can additionally include filling the contact-separating trench with a dielectric material, as described at box 246.

As described at box 250, the method 200 includes forming a pFET local interconnect structure abutting the pFET contact structure above the topmost surface of the insulator pillar, e.g., the pFET local interconnect structure 174. Forming the pFET local interconnect structure can include defining an interconnect trench within the dielectric material adjacent to the nFET contact structure and above the topmost surface of the insulator pillar, as shown with box 252. Forming the pFET local interconnect structure can also include filling the interconnect trench with an interconnect metal, as shown with box 254.

As shown with box 260, the method 200 includes forming an nFET contact structure wrapped about the nFET section below the topmost surface of the insulator pillar, e.g., the nFET contact structure 116 (shown in FIG. 3). Forming the nFET contact structure can include depositing a metal layer over the pFET section, the nFET section, and the topmost surface of the insulator pillar, as shown with box 262. Forming the nFET contact structure can also include defining a contact-separating trench having a lower recess below the topmost surface of the insulator pillar within the metal layer, the contact-separating trench over the pFET section and the nFET section, as shown with box 264. Forming the nFET contact structure can additionally include filling the contact-separating trench with a dielectric material, as shown with box 266.

As shown with box 270, the method 200 incudes forming an nFET local interconnect structure abutting the nFET contact structure above the topmost surface of the insulator pillar, e.g., the nFET local interconnect structure 120. Forming the nFET local interconnect structure can include defining an interconnect trench within the dielectric material adjacent to the pFET contact structure and above the topmost surface of the insulator pillar, as shown with box 272. Forming the nFET local interconnect structure can also include filling the interconnect trench with an interconnect metal, as shown with box 274.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that includes a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming fork-sheet semiconductor device comprising:
   forming a first-type source/drain region and a second-type source/drain region separated from the first-type source/drain region by an insulator pillar;
   depositing a metal coating that encapsulates the first-type source/drain region, the second-type source/drain region, and the insulator pillar;
   recessing the metal coating to form an inter-contact trench that defines a first-type contact portion and an opposing second-type contact portion separated from the first-type contact portion by the insulator pillar; and
   forming a first upper interconnect structure on the first-type contact portion and a second upper interconnect structure on the second-type contact portion, the second upper interconnect structure electrically isolated from the first upper interconnect structure.

2. The method of claim 1, wherein each of the first-type contact portion and the second-type contact portion extends along a first direction to define a contact width and a second direction orthogonal to the first direction to define a contact height, and wherein a distance separating the first-type contact portion from the second-type contact portion is greater than the contact width.

3. The method of claim 2, wherein forming the first upper interconnect structure and the second upper interconnect structure comprises:
   filling the inter-contact trench with a dielectric coating that covers the first-type contact portion, the second-type contact portion, and the insulator pillar;
   forming first and second interconnect recesses in the dielectric coating to partially expose the first-type contact portion and the second-type contact portion, respectively; and
   filling the first and second interconnect recesses with a metal material to form the first upper interconnect structure and the second upper interconnect structure.

4. The method of claim 3, wherein each of the first upper interconnect structure and the second upper interconnect structure extends along the first direction to define an upper contact width and the second direction define an upper contact height, and wherein a second distance separating the first upper interconnect structure from the second upper interconnect structure is greater than the upper contact width.

5. The method of claim 4, wherein depositing a metal coating includes completely covering an upper surface and exposed sidewall of each of the first-type source/drain region and a second-type source/drain region.

6. The method of claim 5, wherein the metal coating on the upper surface of the first-type source/drain region and a second-type source/drain region extends along the first direction to define a lower contact width,
   wherein the upper contact width is greater than the contact width of the first-type contact portion and the second-type contact portion, and
   wherein the lower contact width is greater than the upper contact width and the contact width of the first-type contact portion and the second-type contact portion.

7. The method of claim 5, wherein recessing the metal coating further comprises performing an etching process that etches the metal coating selective to the insulator pillar to expose a topmost surface of the insulator pillar.

8. The method of claim 7, wherein recessing the metal coating further comprises recessing the metal coating until a portion of the metal coating remaining on the upper surface of each of the first-type source/drain region and the second-type source/drain region is below the topmost surface of the insulator pillar.

9. A fork-sheet semiconductor device comprising:
   a first-type source/drain region on a substrate and a second-type source/drain region on the substrate and separated from the first-type source/drain region by an insulator pillar;
   a metal coating including a first metal portion that completely covers a first upper surface and a first exposed sidewall the first-type source/drain region and a second metal portion that completely covers a second upper surface and a second exposed sidewall the second-type source/drain region, the first and second metal portions separated from one another by the insulator pillar that is interposed therebetween;

a first-type contact portion extending vertically from the first metal portion and an opposing second-type contact portion extending vertically from the second metal portion; and a first upper interconnect structure that contacts the first-type contact portion and a second upper interconnect structure that contacts the second-type contact portion.

10. The fork-sheet semiconductor device of claim 9, wherein each of the first-type contact portion and the second-type contact portion extends along a first direction to define a contact width and a second direction orthogonal to the first direction to define a contact height, and wherein a distance separating the first-type contact portion from the second-type contact portion is greater than the contact width.

11. The fork-sheet semiconductor device of claim 9, wherein the insulator pillar extends above an upper surface of the first and second metal portions.

12. The fork-sheet semiconductor device of claim 10, wherein each of the first upper interconnect structure and the second upper interconnect structure extends along the first direction to define an upper contact width and the second direction define an upper contact height, and wherein a second distance separating the first upper interconnect structure from the second upper interconnect structure is greater than the upper contact width.

13. The fork-sheet semiconductor device of claim 12, wherein the first and second metal portions extend along the first direction to define a metal coating width, and wherein the upper contact width is greater than the contact width of the first-type contact portion and the second-type contact portion.

14. The fork-sheet semiconductor device of claim 13, wherein the metal coating width is greater than the upper contact width and the contact width of the first-type contact portion and the second-type contact portion.

15. A fork-sheet semiconductor device comprising:
a first-type source/drain region on a substrate and a second-type source/drain region on the substrate and separated from the first-type source/drain region by an insulator pillar;
a first silicide layer that completely coats a first upper surface and a first exposed sidewall the first-type source/drain region and a second silicide layer that completely coats a second upper surface and a second exposed sidewall the second-type source/drain region, the first and second silicide layers separated from one another by the insulator pillar that is interposed therebetween;
a wrap-around contact including a first metal portion completely covering the first silicide layer and a second metal portion completely covering the second silicide layer;
a first-type contact portion extending vertically from the first metal portion and an opposing second-type contact portion extending vertically from the second metal portion; and
a first upper interconnect structure that contacts the first-type contact portion and a second upper interconnect structure that contacts the second-type contact portion.

16. The fork-sheet semiconductor device of claim 15, wherein each of the first-type contact portion and the second-type contact portion extends along a first direction to define a contact width and a second direction orthogonal to the first direction to define a contact height, and wherein a distance separating the first-type contact portion from the second-type contact portion is greater than the contact width.

17. The fork-sheet semiconductor device of claim 15, wherein the insulator pillar extends above an upper surface of the first and second metal portions.

18. The fork-sheet semiconductor device of claim 15, wherein the first and second upper interconnect structures are between the top portion of gate electrode included in gate structures of the fork-sheet semiconductor device.

19. The fork-sheet semiconductor device of claim 16, wherein each of the first upper interconnect structure and the second upper interconnect structure extends along the first direction to define an upper contact width and the second direction define an upper contact height, and wherein a second distance separating the first upper interconnect structure from the second upper interconnect structure is greater than the upper contact width.

20. The fork-sheet semiconductor device of claim 19, wherein the first and second metal portions extend along the first direction to define a metal coating width,
wherein the upper contact width is greater than the contact width of the first-type contact portion and the second-type contact portion, and
wherein the metal coating width is greater than the upper contact width and the contact width of the first-type contact portion and the second-type contact portion.

* * * * *